US008890136B2

(12) United States Patent
Yamae

(10) Patent No.: US 8,890,136 B2
(45) Date of Patent: Nov. 18, 2014

(54) PLANAR LIGHT EMITTING DEVICE

(75) Inventor: Kazuyuki Yamae, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/981,445

(22) PCT Filed: Jan. 20, 2012

(86) PCT No.: PCT/JP2012/051174
§ 371 (c)(1),
(2), (4) Date: Jul. 24, 2013

(87) PCT Pub. No.: WO2012/102194
PCT Pub. Date: Aug. 2, 2012

(65) Prior Publication Data
US 2013/0306952 A1    Nov. 21, 2013

(30) Foreign Application Priority Data

Jan. 25, 2011    (JP) .................................. 2011-013497

(51) Int. Cl.
| H01L 35/24 | (2006.01) |
| H01L 51/00 | (2006.01) |
| H01L 51/52 | (2006.01) |
| F21Y 105/00 | (2006.01) |
| H01L 27/32 | (2006.01) |

(52) U.S. Cl.
CPC ........ *H01L 51/5203* (2013.01); *H01L 51/5212* (2013.01); *H01L 51/5228* (2013.01); *F21Y 2105/006* (2013.01); *H01L 2251/5361* (2013.01); *H01L 27/3297* (2013.01)
USPC .......................................................... 257/40

(58) Field of Classification Search
CPC .................. H01L 51/5203; H01L 2251/5361; H01L 51/5228; H01L 51/5212; H01L 27/3297

USPC ............................................................ 257/40
See application file for complete search history.

(56) References Cited

U.S. PATENT DOCUMENTS

| 6,046,547 | A  | 4/2000 | Nishio et al. |
| 6,686,063 | B2 | 2/2004 | Kobayashi |

(Continued)

FOREIGN PATENT DOCUMENTS

| JP | 10-012380 | 1/1998 |
| JP | 10-091342 | 4/1998 |

(Continued)

OTHER PUBLICATIONS

International Search Report dated Feb. 21, 2012 with English language translation.

*Primary Examiner* — Thien F Tran
(74) *Attorney, Agent, or Firm* — Greenblum & Bernstein, P.L.C.

(57) ABSTRACT

A planar light emitting device includes an organic EL element module unit in which plural organic EL elements are arranged side by side, each of the organic EL elements including an anode, a light emitting layer and a cathode that are formed on a first surface side of a first transparent substrate, and a second transparent substrate disposed on a light extraction side of the organic EL element module unit. The organic EL element includes a first through hole wire that is electrically connected to a first part of the anode formed outside a light emitting portion, and a second through hole wire that is electrically connected to a second part of the cathode that extends on the first surface of the first transparent substrate. External connection electrodes for supplying power to the organic EL element module are disposed on a first surface side of the second transparent substrate so as to avoid a projection region of the light emitting portion.

7 Claims, 23 Drawing Sheets

(56) References Cited

U.S. PATENT DOCUMENTS

| | | |
|---|---|---|
| 2002/0068191 A1 | 6/2002 | Kobayashi |
| 2006/0087224 A1 | 4/2006 | Oki et al. |
| 2007/0053202 A1* | 3/2007 | Sera et al. .................... 362/559 |
| 2009/0302760 A1 | 12/2009 | Tchakarov et al. |

FOREIGN PATENT DOCUMENTS

| | | |
|---|---|---|
| JP | 10-232628 | 9/1998 |
| JP | 2002-175877 | 6/2002 |
| JP | 2003-317940 | 11/2003 |
| JP | 2005-183352 | 7/2005 |
| JP | 2005-331572 | 12/2005 |
| JP | 2005-338419 | 12/2005 |
| JP | 2006-032056 | 2/2006 |
| JP | 2007-052160 | 3/2007 |
| JP | 2007-536708 | 12/2007 |
| JP | 2009-545113 | 12/2009 |
| WO | 2005/107411 | 11/2005 |
| WO | 2008/012460 | 1/2008 |
| WO | 2011/090039 | 7/2011 |

* cited by examiner (a)

(b)

(c)

(d)

PLANAR LIGHT EMITTING DEVICE

TECHNICAL FIELD

The present invention relates to a planar light emitting device.

BACKGROUND ART

Heretofore, research and development has been conducted on planar light emitting devices that utilize an organic electroluminescent element (hereinafter, simply referred to as "organic EL element") in various places (for example, Patent Literature 1). Note that Patent Literature 1 describes an organic EL element formed on a substrate and has a structure in which an anode, a hole transport layer, a light emitting layer, an electron transport layer and a cathode are stacked. With such types of organic EL elements, in the case where the substrate is constituted by a transparent substrate and the anode is constituted by a transparent conductive film such as an ITO film or the like, light emitted from the light emitting layer by applying a voltage between the anode and the cathode is extracted through the anode and the transparent substrate.

Characteristics of organic EL elements include; being self-light emission type light emitting elements, exhibiting a relatively high efficient light emitting properties, enabling light emission in various types of colors, and the like. Therefore, organic EL elements are expected to be applied as display devices (for example, light emitting bodies such as a flat panel display, and the like) and light sources (for example, backlights of liquid crystal display apparatuses, light sources for illumination, and the like), and they have already been put to practical use in some fields. However, in recent years, development of organic EL elements that have a larger area, high efficiency, long service life, and high luminance has been desired in the case of applying organic EL elements to a planar light emitting device.

Patent Literature 1 described above discloses a planar light emitting device in which plural tiles 205 (see FIG. 25) in which organic EL elements are used are arranged in an array as shown in FIG. 24. Note that the tiles constitute flat panel light emitting units in this planar light emitting device.

As shown in FIG. 25, the tile 205 includes a substrate 235 having a square outer shape, a light emitting region 215 for an organic EL element formed on a first surface side of the substrate 235, and eight contacts 210. Here, the tile 205 is provided with four pairs of contacts; each pair consisting of a contact 210 (hereinafter, also referred to as a "first contact 210A") connected to the anode of the organic EL element and a contact 210 (hereinafter referred to as a "second contact 210K") connected to the cathode. In the planar light emitting device, adjacent tiles 205 are electrically connected to each other via a pair of the first contact 210A and the second contact 210K.

Also, Patent Literature 1 discloses a tile as the tile 205 that includes a substrate 235, a light emitting region 215 for an organic EL element formed on a first surface side of the substrate 235, a cover 240 that covers the light emitting region 215 on the first surface side of the substrate 235 and is joined to the substrate 235 via seal portions 230, and eight contacts 210. Note that Patent Literature 1 describes that organic EL elements are hermetically sealed along with a desiccating agent because they are likely to be affected by moisture and oxygen.

In the tiles 205 having the configuration shown in FIG. 26, the contacts 210 are formed in a region on the first surface side of the substrate 235 where they do not overlap the cover 240 and in a region on the cover 240 where they do not overlap the substrate 235. In addition, Patent Literature 1 describes that the configuration is not limited to the example in FIG. 26 and that the contacts 210 in the tiles 205 may be configured by exposed regions of the anode and the cathode of an organic EL element. In addition, Patent Literature 1 describes that the shape of the substrate 235 is not limited to the square, and for example, it may be a rectangle, triangle, or hexagon.

Also, Patent Literature 1 discloses a planar light emitting device that includes a back face plate 285 that supports plural tiles 205 described above, as shown in FIG. 27. Here, contacts 296 that allow electrical connection between adjacent tiles 205 are formed on the back face plate 285. Note that in the planar light emitting device having the configuration shown in FIG. 27, the tiles 205 are physically held by holding members 290 on the back face plate 285.

Incidentally, with a planar light emitting device that uses one organic EL element, the sheet resistance of an anode constituted by a transparent conductive film is larger than the sheet resistance of a cathode constituted by a metal film, and therefore in the case where the size of a light emitting area is increased, variation on the plane in the current density of a current that flows through the organic EL element is increased due to a drop in the voltage of the anode, as a result of which variation in luminance increases.

In view of this, it is conceivable that a planar light emitting device is configured by arranging plural tiles 205 side by side in order to increase the size of the light emitting area, as disclosed in Patent Literature 1.

CITATION LIST

Patent Literature

Patent Literature 1: JP 2007-536708 A

SUMMARY OF INVENTION

Technical Problem

However, in the planar light emitting device disclosed in Patent Literature 1, the contacts 210 are arranged on the periphery of the tiles 205 as shown in FIGS. 25 and 26, and the contacts 210 of adjacent tiles 205 need to be electrically connected using separate conductive bodies, external connectors, or the like. Therefore, in the planar light emitting device disclosed in Patent Literature 1, the distance between adjacent light emitting regions 215 increases depending on the sizes of the conductive bodies or the external connectors, and the like, and the areas of non-light emitting portions between adjacent light emitting regions 215 increase, as a result of which the design depreciates. In addition, in the planar light emitting device disclosed in Patent Literature 1, for example, the seal portions 230 for sealing an organic EL element for each the 205 are required as shown in FIG. 26, and therefore an increase in the areas of non-light emitting portions between adjacent light emitting regions 215 causes to depreciate the design.

The present invention has been made in light of the above-described circumstances, and it is an object of the present invention to provide a planar light emitting device in which luminance unevenness can be reduced and the design can be improved and in which the size and the service life of a light emitting area are increased.

Solution to Problem

The planer light emitting device of the present invention includes: an organic electroluminescent element module unit in which plural organic electroluminescent elements are arranged side by side, each of the organic electroluminescent elements including an anode, a light emitting layer and a cathode that are formed on a first surface side of a first transparent substrate; a second transparent substrate disposed on a light extraction side of the organic electroluminescent element module unit; and a protector designed to, together with the second transparent substrate, enclose the organic electroluminescent element module unit; and the organic electroluminescent element includes: a light emitting portion defined as an overlap of the first transparent substrate, the anode, the light emitting layer and the cathode in a thickness direction of the first transparent substrate; a first through hole wire that is formed inside a first through hole and is electrically connected to the anode, the first through hole penetrating a first part of the anode that is formed outside the light emitting portion and the first transparent substrate; and a second through hole wire that is formed inside a second through hole and is electrically connected to the cathode, the second through hole penetrating a second part of the cathode that extends on the first surface of the first transparent substrate and the first transparent substrate, and an external connection electrode for receiving high potential and an external connection electrode for receiving low potential which serve to supply power to the organic electroluminescent element module are disposed on a first surface side of the second transparent substrate so as to avoid a projection region of the light emitting portion.

It is preferable that this planer light emitting device includes an auxiliary electrode disposed on the first surface side of the second transparent substrate so as to be overlapped with the first part, the auxiliary electrode being electrically connected to the first part, and the auxiliary electrode being made of material having a smaller specific electrical resistance than that of the anode.

In this planer light emitting device, it is preferable that in the organic electroluminescent element module unit, the adjacent organic electroluminescent elements are disposed so as to partially overlap.

In this planer light emitting device, it is preferable that the protector includes: a rear plate portion facing the second transparent substrate; and a frame portion interposed between the rear plate portion and the second transparent substrate, plural spacers each formed into a cylindrical shape are interposed between a base substrate and the rear plate portion, the base substrate including the second transparent substrate and the respective external connection electrodes formed thereon, and the spacers are inserted into the first through holes.

In this planer light emitting device, it is preferable that the spacers are made of electrically conductive material.

In this planer light emitting device, it is preferable that the protector includes: a rear plate portion that opposes the second transparent substrate; and a frame portion that is interposed between the rear plate portion and the second transparent substrate, plural spacers each formed into a cylindrical shape are interposed between a base substrate and the rear plate portion, the base substrate including the second transparent substrate and the respective external connection electrodes formed thereon, and the spacers penetrate the first transparent substrate at positions that avoid the first through hole, the second through hole and the light emitting portion.

In this planer light emitting device, it is preferable that the plural organic electroluminescent elements are connected in series with each other.

Advantageous Effects of Invention

In the planar light emitting device of the present invention, it is possible to reduce luminance unevenness and improve the design while increasing the size of a light emitting area and the service life.

DESCRIPTION OF EMBODIMENTS

Embodiment 1

Figure 1:
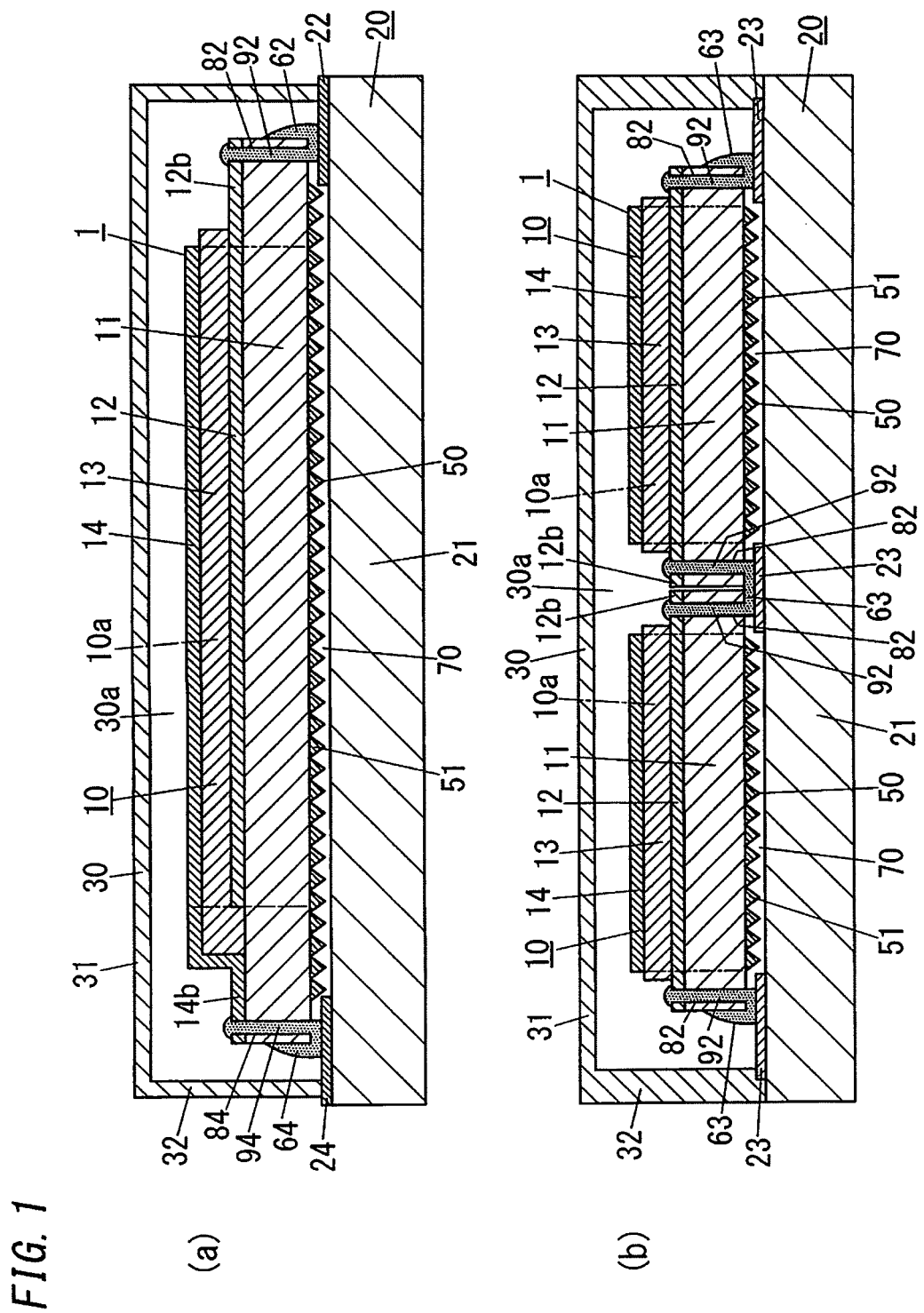
FIG. 1 relates FIGS. 1(a) and 1(b) relate to a planar light emitting device of Embodiment 1, and shows (a) a schematic cross-sectional view taken along A-A' in FIG. 2(a) and (b) a schematic cross-sectional view taken along B-B' in FIG. 2(a).
Figure 2:
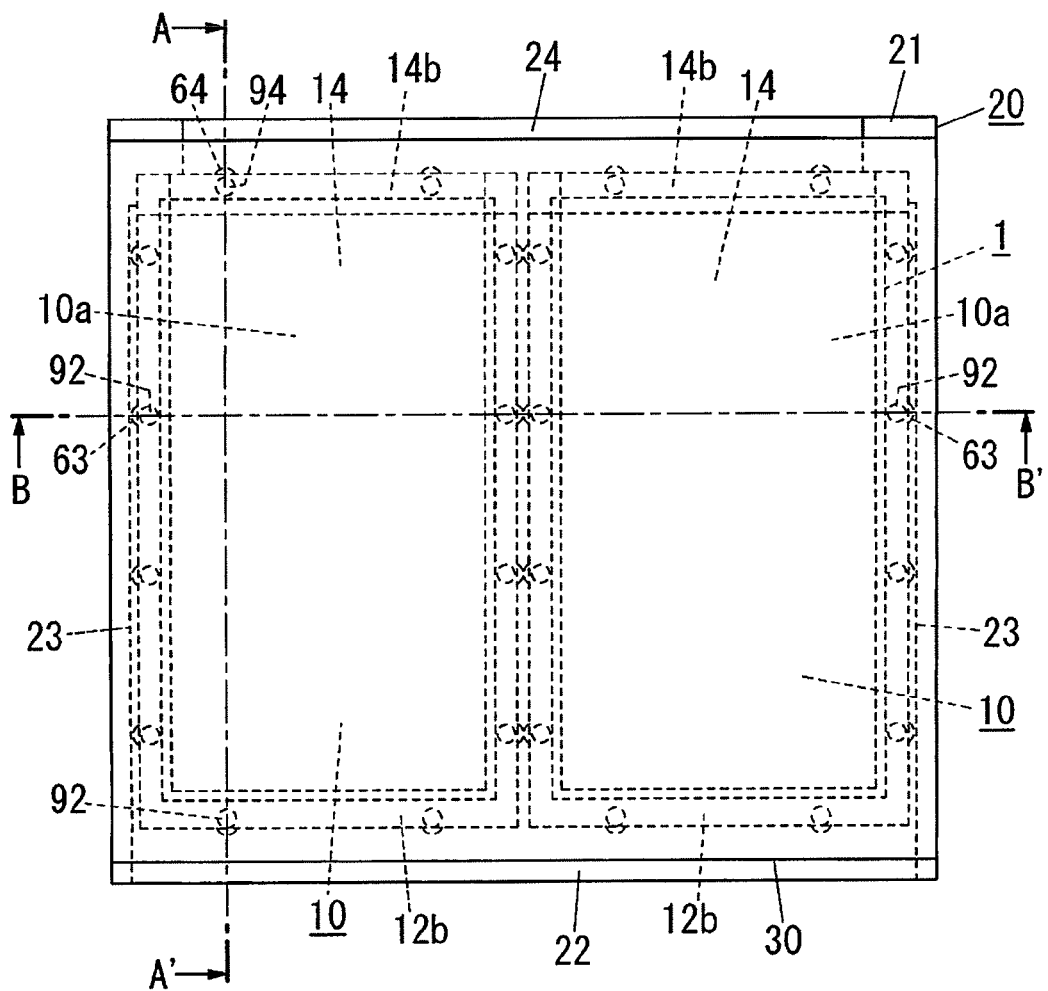
FIGS. 2(a) and 2(b) show (a) a schematic plan view of the planar light emitting device above and (b) a schematic cross-sectional view of an organic EL element.
Figure 2:
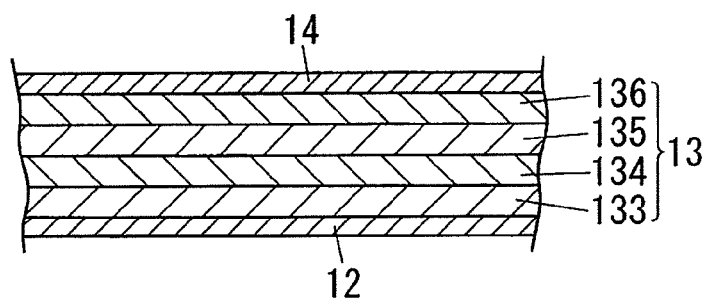
Figure 3:
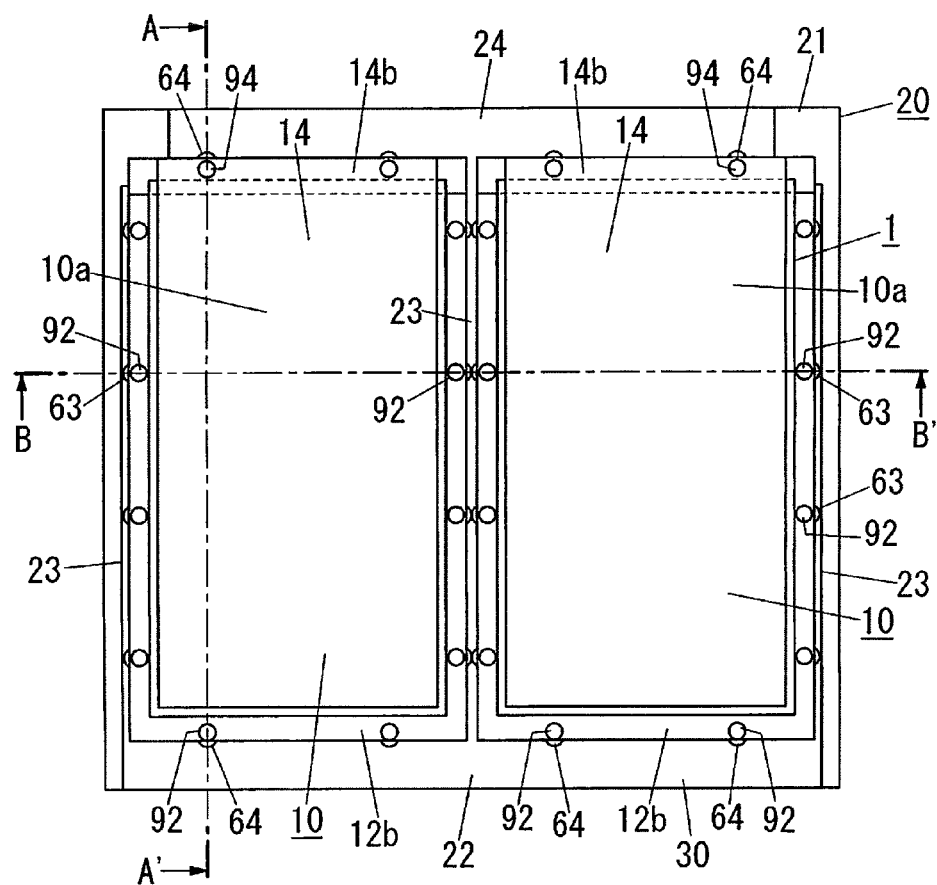
FIG. 3 is a schematic plan view of the planar light emitting device above in a state in which a protector is detached from the planar light emitting device.
Figure 4:
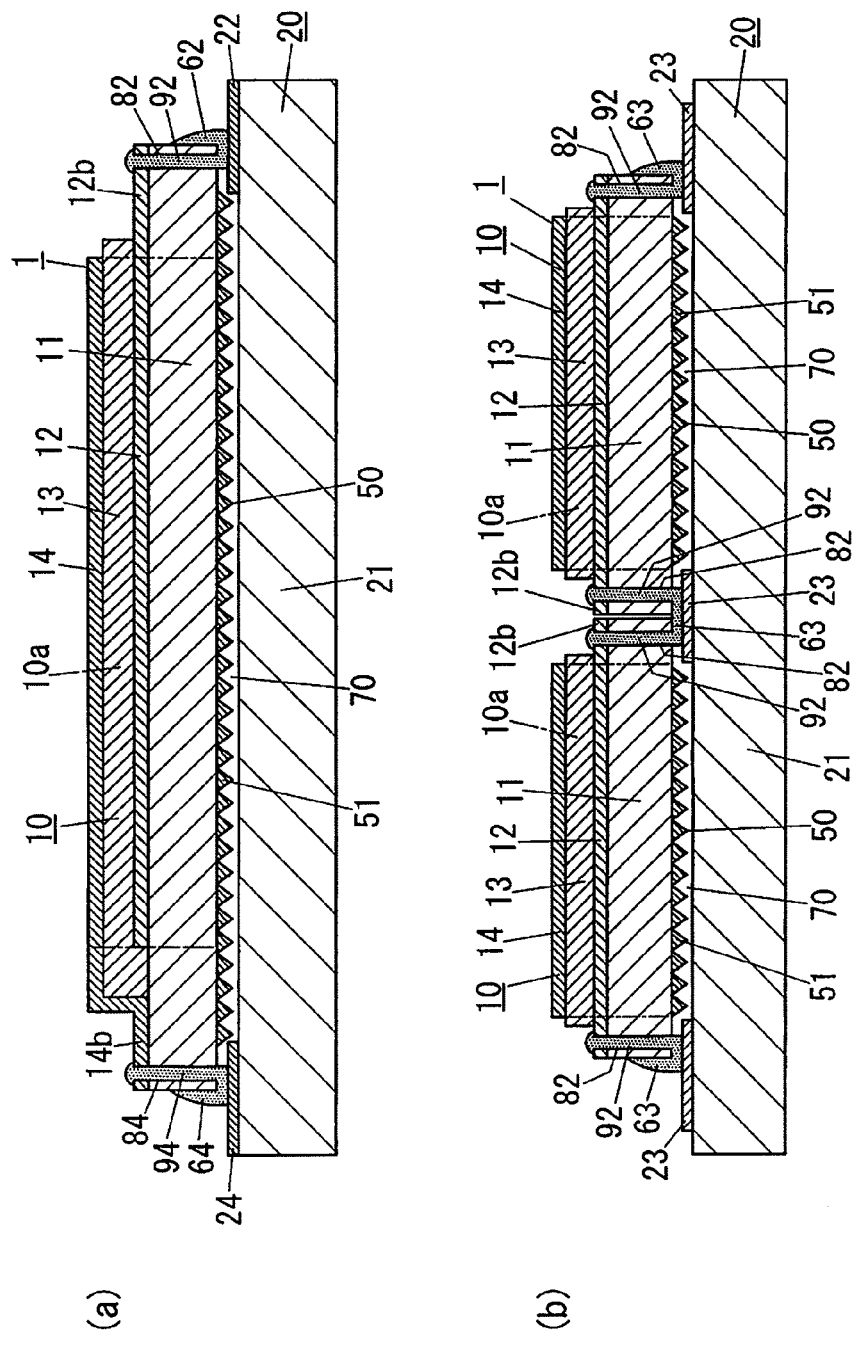
FIGS. 4(a) and 4(b) relate to a state in which the protector is detached from the planar light emitting device, and shows (a) a schematic plan view taken along A-A' in FIG. 3 and (b) a schematic cross-sectional view taken along B-B' in FIG. 3.

Hereinafter, a planar light emitting device of the present embodiment will now be described based on FIGS. 1 to 6.

The planar light emitting device includes an organic EL element module unit 1 in which plural organic EL elements 10 (two in the example shown in the figures) are arranged side by side, each of the organic EL elements including an anode 12, a light emitting layer 134 and a cathode 14 that are formed on a first surface side of a first transparent substrate 11. Also, the planar light emitting device includes a second transparent substrate 21 disposed on a light extraction side of the organic EL element module unit 1 and a protector 30 designed to, together with the second transparent substrate 21, enclose the organic EL element module unit 1.

In the organic EL element 10, the organic EL layer 13 interposed between the anode 12 and the cathode 14 includes, in order from the anode 12, a hole transport layer 133, the above-described light emitting layer 134, an electron transport layer 135 and an electron injection layer 136. Here, in the organic EL element 10, the anode 12 is stacked on the first surface side of the first transparent substrate 11, and the cathode 14 is located on the opposite side of the anode 12 from the side of the first transparent substrate 11 and faces the anode 12.

In the organic EL element 10, a region where the first transparent substrate 11, the anode 12, the above-described light emitting layer 134 and the cathode 14 are overlapped in the thickness direction of the first transparent substrate 11 constitutes a light emitting portion 10a, and a region other than the light emitting portion 10a serves as a non-light emitting portion. Note that the thickness direction of the organic EL element 10 is the same as the thickness direction of the first transparent substrate 11.

In the organic EL element 10, the organic EL layer 13 that includes the light emitting layer 134 is formed on the first surface side of the first transparent substrate 11, and light can be extracted from a first face side of the organic EL element 10 in the thickness direction. In contrast, the second transparent substrate 21 is disposed on the first face side of the organic EL element 10. Here, the second transparent substrate 21 has a lower refractive index than that of the first transparent substrate 11. Also, the second transparent substrate 21 has a higher waterproofness and weatherability than those of the first transparent substrate 11. Moreover, the protector 30 is for covering a second face side of the organic EL element 10 in the thickness direction, and, together with the second transparent substrate 21, has a function of preventing moisture from reaching the organic EL element 10.

Also, the organic EL element 10 includes a first part (hereinafter, referred to as an "anode extension part") 12b of the anode 12 formed outside the light emitting portion 10a. In addition, the organic EL element 10 includes a first through hole wire 92 electrically connected to the anode extension part 12b. Here, the first through hole wire 92 is formed inside a first through hole 82 and is electrically connected to the anode extension part 12b of the anode 12, the first through hole 82 penetrating the anode extension part 12b and the first transparent substrate 11 in the thickness direction. Also, the organic EL element 10 includes a second part (hereinafter, referred to as a "cathode extension part") 14b of the cathode 14 that extends on the first surface of the first transparent substrate 11. In addition, the organic EL element 10 is formed inside a second through hole 84 and is electrically connected to the cathode extension part 14b of the cathode 14, the second through hole 84 penetrating the cathode extension part 14b and the first transparent substrate 11 in the thickness direction.

Also, in the planar light emitting device, an external connection electrode 22 for receiving high potential and an external connection electrode 24 for receiving low potential which serve to supply power to the organic EL element module 1 are disposed on a first surface side of the second transparent substrate 21 so as to avoid a projection region of the light emitting portion 10a. Note that hereinafter, the second transparent substrate 21 provided with the external connection electrodes 22 and 24 is referred to as a base substrate 20.

Also, the planar light emitting device includes an auxiliary electrode 23 disposed on the first surface side of the second transparent substrate 21 so as to be overlapped with the anode extension part 12b, the auxiliary electrode 23 being electrically connected to the anode extension portion 12b. In other words, in the base substrate 20, the auxiliary electrode 23 is formed on the first surface side of the second transparent substrate 21. Here, the auxiliary electrode 23 is formed of material having a smaller specific electrical resistance than that of the anode 12.

Also, the planar light emitting device includes a light extraction structure portion 50 provided between the first face of the organic EL element 10 and the second transparent substrate 21 and that suppresses reflection of light emitted from the light emitting layer 134 on the first face.

Hereinafter, each constituent element of the planar light emitting device will now be described in detail.

In the organic EL element 10, the anode 12 is a transparent electrode, the cathode 14 is an electrode that reflects light emitted from the light emitting layer 134, and a second surface of the first transparent substrate 11 serves as the first face.

The layered structure of the organic EL layer 13 described above is not limited to the above-described example, and for example, a single layer structure of the light emitting layer 134, a layered structure of the hole transport layer 133, the light emitting layer 134 and the electron transport layer 135, a layered structure of the hole transport layer 133 and the light emitting layer 134, a layered structure of the light emitting layer 134 and the electron transport layer 135, and the like may be adopted. Also, a hole injection layer may be interposed between the anode 12 and the hole transport layer 133. Also, the light emitting layer 134 may have a single layer structure or a multilayer structure. For example, in the case where the desired color of emitted light is white, the light emitting layer may be doped with three types of dopant pigments (red, green and blue), a layered structure of a blue hole transporting light emitting layer, a green electron transporting light emitting layer and a red electron transporting light emitting layer may be adopted, or a layered structure of a blue electron transporting light emitting layer, a green electron transporting light emitting layer and a red electron transporting light emitting layer may be adopted. Also, an organic EL layer 13 having a function of emitting light when voltage is applied between the anode 12 and the cathode 14 that holds the organic EL layer 13 therebetween can be treated as a single light emitting unit. In this case, a multiunit structure may be adopted. The multiunit structure is a structure in which plural light emitting units are stacked while intermediate layers having light transparency and electrical conductivity are interposed therebetween and are electrically connected in series (that is, a structure in which plural light emitting units that are overlaid in the thickness direction are provided between one anode 12 and one cathode 14).

Also, in the case where light is emitted from a second face side of the organic EL element 10 in the thickness direction, a reflective film which may be an Al film may be provided on the second surface of the first transparent substrate 11, and the cathode 14 may be, for example, a transparent electrode. Also, in this case, it is preferable that the light extraction structure portion 50 be provided on a surface side of the cathode 14.

Also, the plan view shape of the first transparent substrate 11 is set to a rectangular-like shape. Here, the first transparent substrate 11 may have a rectangular or square shape, as long as it has a rectangular-like shape.

The anode 12 is an electrode for injecting holes into the light emitting layer, and it is preferable to use electrode material including metal, alloy or an electrically conductive compound that has a large work function, or a mixture thereof and it is preferable to use electrode material having a work function of 4 eV or more to 6 eV or less so that the difference between HOMO (highest occupied molecular orbital) level and the work function of the anode is not significantly increased. Examples of electrode material for the anode 12 include ITO, tin oxide, zinc oxide, IZO and copper iodide, conductive polymers such as PEDOT and polyaniline, conductive polymers that are doped with any acceptor or the like, and conductive light-transmissive material such as carbon nanotube or the like. Here, the anode 12 may be formed on the first surface side of the first transparent substrate 11 as a thin film by a sputtering method, a vacuum vapor deposition method, a coating method, or the like.

Note that it is preferable that the sheet resistance of the anode 12 be several hundreds $\Omega/\square$ (ohms per square) or less, and it is particularly preferable that it be $100\Omega/\square$ (ohms per square) or less. Here, although the film thickness of the anode 12 changes depending on the light transmittance, the sheet resistance and the like of the anode 12, it is favorable to set the film thickness thereof to be less than or equal to 500 nm, preferably to be set in a range of 10 nm to 200 nm.

Also, the cathode 14 is an electrode for injecting electrons into the light emitting layer, and it is preferable to use electrode material including metal, alloy or an electrically conductive compound that has a small work function, or a mixture thereof, and it is preferable to use electrode material having a work function of 1.9 eV or more to 5 eV or less so that the difference between LUMO (lowest unoccupied molecular orbital) level and the work function of the cathode is not significantly increased. Examples of electrode material for the cathode 14 include aluminum, silver, magnesium and the like, and an alloy of these and another metal, for example, magnesium-silver mixture, magnesium-indium mixture, and aluminum-lithium alloy. Also, it is possible to use a film obtained by layering an ultrathin film made of electrically conductive material made of metal, metal oxide or the like, or a mixture of these and another metal, for example, aluminum oxide (here, thin film of 1 nm or less that is capable of allowing electrons to flow by tunnel injection) and a thin film made of aluminum, and the like. Moreover, in the case where light is extracted from the cathode 14 side, for example, ITO, IZO and the like may be adopted.

As material for the light emitting layer 134, it is possible to use any material that is known as material for an organic EL element. Examples thereof include material such as anthracene, naphthalene, pyrene, tetracene, coronene, perylene, phthaloperylene, naphthaloperylene, diphenyl butadiene, tetraphenyl butadiene, coumarin, oxadiazole, bisbenzoxazoline, bisstyryl, cyclopentadiene, quinoline metal complex, tris(8-hydroxyquinolinato)aluminum complex, tris (4-methyl-8-quinolinato)aluminum complex, tris(5-phenyl-8-quinolinato)aluminum complex, aminoquinoline metal complex, benzo quinoline metal complex, tri-(p-terphenyl-4-yl)amine, 1-aryl-2,5-di(2-thienyl)pyrrole derivatives, pyran, quinacridone, rubrene, distyryl benzene derivatives, distyryl arylene derivatives, distyryl amine derivatives, various types of fluorescent pigments and the like, and the derivatives thereof, but are not limited thereto. Also, it is preferable that luminescent materials selected from these compounds are mixed and used as appropriate. Moreover, it is also possible to preferably use not only compounds typified by the above-described compounds that cause fluorescence but also material that emits light from spin multiplet, for example, phosphorescent material that causes phosphorescence, and compounds having a site constituted by them in a portion of a molecule. Also, the light emitting layer 134 made of these materials may be formed into a film by a dry process such as a vapor deposition method, a transfer method and the like, or may be formed into a film by a wet process such as a spin coating method, spray coating method, dye coating method, gravure printing method and the like.

Material used for the above-described hole injection layer can be formed by using organic material and metal oxide that allow hole injection, that is, a so-called acceptor-based organic material or inorganic material, p-doped layer and the like. Organic material that allows hole injection is capable of transporting holes, and has a work function of about 5.0 to 6.0 eV, and examples thereof include material that exhibits strong adherence with the anode 12, and the like, for example, CuPc, starburst amine and the like. Also, a metal oxide that allows hole injection is a metal oxide containing any of, for example, molybdenum, rhenium, tungsten, vanadium, zinc, indium, tin, gallium, titanium, and aluminum. Moreover, a metal oxide may be not only an oxide of only one type of metal but also an oxide of plural types of metal containing any metal described above, such as indium and tin, indium and zinc, aluminum and gallium, gallium and zinc, titanium and niobium, and the like. Also, a hole injection layer made of these materials may be formed into a film by a dry process such as a vapor deposition method, a transfer method and the like, or may be formed into a film by a wet process such as a spin coating method, spray coating method, dye coating method, gravure printing method and the like.

Also, material used for the hole transport layer 133 can be selected from, for example, the group of compounds that allow hole transport. Examples of such types of compounds include arylamine-based compounds, amine compounds containing a carbazole group, amine compounds containing fluorene derivatives and the like, such as 4,4'-bis[N-(naphthyl)-N-phenyl-amino]biphenyl (α-NPD), N,N'-bis(3- methylphenyl)-(1,1'-biphenyl)-4,4'-diamine (TPD), 2-TNATA, 4,4',4"-tris(N-(3-methylphenyl)N-phenylamino) triphenylamine (MTDATA), 4,4'-N,N'-dicarbazole biphenyl (CBP), spiro-NPD, spiro-TPD, spiro-TAD, TNB and the like as representative examples, and any hole transport material that is generally known can be used.

Also, material used for the electron transport layer 135 can be selected from the group of compounds that allow electron transport. Examples of such types of compounds include a metal complex that is known as electron transporting material such as $Alq_3$ or the like, and compounds having a heterocycle such as phenanthroline derivatives, pyridine derivatives, tetrazine derivatives, oxadiazole derivatives and the like, but are not limited thereto, and any electron transport material that is generally known can be used.

Also, material for the electron injection layer 136 can be arbitrarily selected from, for example, metal fluorides such as lithium fluoride, magnesium fluoride and the like, metal halide compounds such as metal chlorides typified by sodium chloride, magnesium chloride and the like, oxides, nitrides, carbides, oxynitrides and the like of various types of metals such as aluminum, cobalt, zirconium, titanium, vanadium, niobium, chromium, tantalum, tungsten, manganese, molybdenum, ruthenium, iron, nickel, copper, gallium, zinc, silicon and the like, for example, aluminum oxide, magnesium oxide, iron oxide, aluminum nitride, silicon nitride, silicon carbide, silicon oxynitride, boron nitride and the like serving as insulating material, silicon compounds such as $SiO_2$, SiO and the like, and carbon compounds and the like. These materials can be formed into a thin film shape by a vacuum vapor deposition method, a sputtering method or the like.

As the first transparent substrate 11, polyethylene terephthalate (PET) substrate is used, which is one type of plastic substrate that is less expensive and has a larger refractive index than inexpensive glass substrates such as an alkali-free glass substrate, a soda-lime glass substrate and the like. Plastic material for plastic substrates are not limited to PET, and for example, polyethylene naphthalate (PEN), polyethersulfone (PES), polycarbonate (PC) and the like may be adopted, and may be selected as appropriate in accordance with a desired usage, refractive index, heat resistant temperature and the like. Note that PET is significantly inexpensive and safe plastic material. Also, PEN has higher refractive index and better heat resistance than those of PET but is expensive.

Incidentally, in the case where a glass substrate is used as the first transparent substrate 11, unevenness of the first surface of the first transparent substrate 11 may cause leakage current and the like of the organic EL element 10 (may cause deterioration of the organic EL element 10). Therefore, in the case where a glass substrate is used as the first transparent substrate 11, the cost increases because it is necessary to prepare a glass substrate for forming the element that is highly precisely polished such that the surface roughness of the first surface is reduced. Note that it is preferable that with regard to the surface roughness of the first surface of the first transparent substrate 11, the arithmetic average roughness Ra defined in JIS B 0601-2001 (ISO 4287-1997) is several nm or less.

In contrast, a plastic substrate is used as the first transparent substrate 11 in the present embodiment, and therefore it is possible to obtain a substrate whose arithmetic average roughness Ra of the first surface is several nm or less at low cost even if highly precise polishing is not particularly performed.

Although an alkali-free glass substrate, which is an inexpensive glass substrate compared with a high-refractive glass substrate, is used as the second transparent substrate 21, the second transparent substrate 21 is not limited thereto, and for example, a soda-lime glass substrate may be used. Also, a glass substrate used as the second transparent substrate 21 is not used for forming the organic EL element 10, and therefore a glass substrate having an arithmetic average roughness Ra of several 100 nm or more can be used and the cost of the planar light emitting device can be reduced as compared with a planar light emitting device in which an organic EL element is formed by using a glass substrate for forming the element.

Note that in the organic EL element 10, a region of the second surface of the first transparent substrate 11 that is defined as an overlapped and projected area of three elements, namely, the anode 12, the organic EL layer 13 and the cathode 14 serves as a light emitting face.

The protector 30 is formed using a glass substrate (for example, an inexpensive glass substrate such as a soda-lime glass substrate, an alkali-free glass substrate, or the like). An accommodation recess 30a that accommodates the organic EL element 10 is formed on a face of the protector 30 facing the base substrate 20, and the protector 30 is joined to the base substrate 20 at the entire periphery of the accommodation recess 30a in the above-described facing face. Thus, the organic EL element 10 is accommodated in an airtight space enclosed by the base substrate 20 and the protector 30. Here, in the base substrate 20, the external connection electrodes 22 and 24 and the auxiliary electrodes 23 are provided on a first surface side of the second transparent substrate 21 as described above, and a portion of the above-described periphery of the protector 30 is joined to the external connection electrodes 22 and 24 and the auxiliary electrodes 23. A rectangular plate-shaped part of the protector 30 facing the second transparent substrate 21 constitutes a rear plate portion 31, and a rectangular frame-shaped part interposed between the rear plate portion 31 and the second transparent substrate 21 constitutes a frame portion 32.

A joint portion joins the protector 30 and the second transparent substrate 21. Examples of the joint portion may include for example, low melting glass, an adhesive film, a thermosetting resin, an ultraviolet-curing resin, an adhesive (for example, an epoxy resin, acrylic resin, silicone resin and so on) or the like. The external connection electrodes 22 and 24 may be formed of, for example, an Au film, Al film, and ITO film, and the material and layer structures thereof are not particularly limited and may be appropriately selected, in consideration of adherence with underlying material, contact resistance of a part that is electrically connected thereto and the like. The layer structure thereof is not limited to a single layer structure and may be a multilayer structure.

Also, water absorbing material (not shown) that absorbs moisture is affixed to an inner bottom face of the accommodation recess 30a of the protector 30. As such water absorbing material, for example, a calcium oxide-based desiccating agent (getter in which calcium oxide is mixed) and the like may be used. Note that the protector 30 may be made of an epoxy resin, silicone resin or the like that seals the organic EL element 10.

Also, in the planar light emitting device of the present embodiment, the above-described light extraction structure portion 50 is constituted by an uneven structure portion 51 provided on the first face side of the organic EL element 10, and a space 70 is present between the uneven structure portion 51 and the second transparent substrate 21. Thus, with the planar light emitting device of the present embodiment, it is possible to reduce loss of light by suppressing reflection of light that is emitted from the light emitting layer 134 and reaches the second transparent substrate 21. Hence, the efficiency in light extraction can be improved.

However, the refractive index of each of the light emitting layer 134 and the first transparent substrate 11 of the organic EL element 10 is larger than that of air that is an external atmosphere to which light is extracted. Therefore, in the case where the above-described light extraction structure portion 50 is not provided, and a space between the first transparent substrate 11 and the second transparent substrate 21 is in an air atmosphere, total reflection occurs at the interface between a first medium constituted by the first transparent substrate 11 and a second medium constituted by air, and light incident at an angle of the total reflection angle or more on the interface is reflected. The light reflected at the interface between the first medium and the second medium then undergoes multiple reflection inside the organic EL layer 13 or the first transparent substrate 11, and is attenuated without being extracted to the outside. Therefore, the efficiency in light extraction decreases. Also, since the light incident on the interface between the first medium and the second medium at an angle of less than the total reflection also undergoes Fresnel reflection, the efficiency in light extraction decreases.

In contrast, the above-described light extraction structure portion 50 is provided on the first face side of the organic EL element 10 in the present embodiment, and therefore it is possible to improve the efficiency in light extraction from the organic EL element 10 to the outside.

The uneven structure portion 51 constituting the light extraction structure portion 50 has a two dimensional periodic structure. Here, in the case where the wavelength of light emitted from the light emitting layer 134 is in the range of 300 to 800 nm, it is preferable to appropriately set the period of the two dimensional periodic structure in the range of ¼ to 10 times of the wavelength λ where the wavelength in the medium is λ (a value obtained by dividing the wavelength in vacuo by the refractive index of the medium).

In the case where the period is set in, for example, the range of 5λ to 10λ, the efficiency in light extraction is improved owing to a geometrical-optical effect, that is, an increase in the area of the surface where the incidence angle is less than the total reflection angle. Also, in the case where the period is set in, for example, the range of 1λ to 5λ, the efficiency in light extraction is improved owing to the function of extracting light having the incident angle equal to the total reflection angle or more as diffracted light. Moreover, in the case where the period is set in the range of λ/4 to 1λ, the effective refractive index of the vicinity of the uneven structure portion 51 gradually decreases as the distance from the first surface of the first transparent substrate 11 increases, which is equivalent to the case where a thin film layer having an intermediate refractive index between the refractive index of the medium of the uneven structure portion 51 and the refractive index of the medium of the space 70 is interposed between the first transparent substrate 11 and the space 70, as a result of which Fresnel reflection can be reduced. In short, if the period is set in λ/4 to 10λ, it is possible to suppress reflection (total reflection or Fresnel reflection) and to improve the efficiency in light extraction from the organic EL element 10. However, the efficiency in light extraction caused by a geometrical-optical effect can be improved unless an upper limit of the period exceeds 1000λ. Also, the uneven structure portion 51 does not necessarily have a periodic structure such as a two dimensional periodic structure or the like, and an uneven structure that has random size of unevenness or an uneven structure that does not have periodicity can improve the efficiency in light extraction. Note that in the case where uneven structures having different sizes are mixed (for example, in the case where an uneven structure in which the period is 1λ and an uneven structure in which the period is 5λ or more are mixed), the effect of light extraction from an uneven structure occupying the most space in the uneven structure portion 51 among uneven structures is dominant.

Although the uneven structure portion 51 of the light extraction structure portion 50 can be a prism sheet (for example, an optical diffusion film such as LIGHT-UP (registered trademark) GM3 made by KEVIOTO CO., LTD. or the like), the uneven structure portion 51 is not limited to this. For example, the uneven structure portion 51 may be formed on the second surface of the first transparent substrate 11 by an imprinting method (a nanoimprinting method), or the first transparent substrate 11 may be formed by injection molding to directly form the uneven structure portion 51 on the first transparent substrate 11 using an appropriate metal mold. Usually, material used for the above-described prism sheet is often a resin having a refractive index of about 1.4 to 1.6 (that is, a general resin whose refractive index is close to the refractive index of the glass substrate), and is not a resin having a higher refractive index than that of a general resin. Therefore, as the present embodiment, a plastic substrate having a higher refractive index than that of the glass substrate is used as the first transparent substrate 11, and in the case where the refractive index of the uneven structure portion 51 is lower than that of the first transparent substrate 11, total reflection occurs at the interface (a refractive index interface) between the first transparent substrate 11 and the uneven structure portion 51, and loss in light extraction occurs. In view of this, in the planar light emitting device of the present embodiment, the refractive index of the uneven structure portion 51 is set to be greater than or equal to the refractive index of the first transparent substrate 11 (the refractive index of the uneven structure portion 51 is set so as not to be lower than the refractive index of the first transparent substrate 11) while a plastic substrate having a higher refractive index than that of the glass substrate is used as the first transparent substrate 11, and it is thereby possible to prevent total reflection at the interface between the first transparent substrate 11 and the uneven structure portion 51 and to improve the efficiency in light extraction. Note that although the uneven structure portion 51 is, for example, a two dimensional periodic structure in which quadrangular pyramids having a height of 5 μm and a base angle of 45° are arranged at 10 μm pitch in a two dimensional array, the shapes and numerical values thereof are merely examples, and the uneven structure portion 51 of the present invention is not limited thereto.

The refractive index of the uneven structure portion 51 is set to be greater than or equal to the refractive index of the first transparent substrate 11 in the planar light emitting device of the present embodiment, and it is thereby possible to reduce light loss resulting from total reflection at the interface between the first transparent substrate 11 and the uneven structure portion 51 and to improve the efficiency in light extraction. Also, a region where the second transparent substrate 21 and the uneven structure portion 51 comes into contact in a planar manner is provided in the planar light emitting device of the present embodiment, and it is thereby possible to reduce light loss resulting from total reflection and to improve the efficiency in light extraction. Here, for example, in the case of an example in which the uneven structure portion 51 includes a large amount of protruded portions, for example, the shape of the protruded portion may be a cylindrical shape (for example, a circular cylindrical shape, a hexagonal prismatic shape and the like) or a frustum shape (a circular truncated conical shape, a truncated pyramidal shape and the like). Also, in the case of a shape in which the uneven structure portion 51 includes a large amount of recessed portions, for example, the shape of the recessed portion may be a quadrangular pyramidal shape, a hemispherical shape, a circular cylindrical shape, and the like.

In the case where the refractive index of the first transparent substrate 11 is, for example, 1.75, examples of a method for obtaining the uneven structure portion 51 having a higher refractive index than that of the first transparent substrate 11 include the above-described imprinting method. A thermal imprinting method (a thermal nanoimprinting method), an optical imprinting method (an optical nanoimprinting method), and the like can be adopted as an imprinting method.

In the light extraction structure portion 50, it is important for a space 70 to be present between the surface of the uneven structure portion 51 and the second transparent substrate 21. If the entire surface of the uneven structure portion 51 serves as the interface between the uneven structure portion 51 and the second transparent substrate 21 and the space 70 is not present, a refractive index interface between the second transparent substrate 21 and the external air is present, and therefore total reflection occurs again at the refractive index interface. In contrast, with the planar light emitting device of the present embodiment, it is possible to temporarily extract light of the organic EL element 10 to the space 70, and therefore total reflection does not occur at the interface between the air of the space 70 and the second transparent substrate 21 or the interface between the second transparent substrate 21 and the external air.

As described above, it is desirable that the space 70 is present between the surface of the uneven structure portion 51 constituting the light extraction structure portion 50 and the second transparent substrate 21. However, there is a case where it is preferable to fill the space 70 with transparent material, taking into consideration the mechanical strength of the planar light emitting device and the simplicity of a preparing process. In this case, if a light transmissive portion made of transparent material having a refractive index lower than or equal to that of the second transparent substrate 21 is provided between the uneven structure portion 51 and the second transparent substrate 21, it is possible to reduce loss resulting from total reflection and to improve the efficiency in light extraction. Here, as transparent material for the light transmissive portion, material, for example, silica aerogel (n=1.05), whose refractive index is significantly close to 1, that is, material having a low refractive index small enough to be considered to be equal to the refractive index of air, is particularly preferable.

The planar light emitting device of the present embodiment includes the second transparent substrate 21 separately from the first transparent substrate 11 of the organic EL element 10, and therefore it is possible to increase waterproofness and weatherability without using the first transparent substrate which is formed of a glass substrate having a high refractive index or a plastic substrate provided with a barrier layer is provided. Also, it is possible to use a substrate having a higher refractive index than that of a general glass substrate such as a soda-lime glass substrate or an alkali-free glass substrate as the first transparent substrate 11 in the planar light emitting device of the present embodiment, and therefore it is possible to reduce total reflection loss between the light emitting layer 134 and the first transparent substrate 11. Moreover, the planar light emitting device of the present embodiment includes the light extraction structure portion 50 that is provided between the first face of the organic EL element 10 and the second transparent substrate 21 and that suppresses total reflection of light emitted from the light emitting layer 134 on the first face, and therefore it is possible to improve the efficiency in light extraction. Thus, according to the planar light emitting device of the present embodiment, it is possible to improve the efficiency in light extraction and to increase the weatherability and waterproofness.

Also, in the planar light emitting device of the present embodiment, a plastic substrate provided with no barrier layer is used as the first transparent substrate 11, a glass substrate such as a soda-lime glass substrate or an alkali-free glass substrate is used as the second transparent substrate 21, and therefore it is possible to reduce the cost and to prevent a drop in long-term reliability of the organic EL element 10 due to ultraviolet rays from the outside.

Incidentally, with the planar light emitting device of the present embodiment, it is desirable to reduce Fresnel loss when the second transparent substrate 21 transmits light. As means for suppressing Fresnel loss, for example, it is conceivable that an anti-reflection coat (hereinafter, simply referred to as an "AR film") which is a single-layer dielectric film or multilayer dielectric film is provided on at least one face of the second transparent substrate 21 in the thickness direction. Here, if the AR film is, for example, a magnesium fluoride film ($MgF_2$ film) having a refractive index n of 1.38, and a prescribed wavelength $\lambda_0$ is 550 nm, the thickness of the AR film needs only to be set to $\lambda_0/4n=550/(4\times1.38)=99.6$ nm. Similarly, if the AR film is, for example, an aluminum oxide film ($Al_2O_3$ film) having a refractive index n of 1.58, and a prescribed wavelength $\lambda_0$ is 550 nm, the thickness of the AR film needs only to be set to $\lambda_0/4n=550/(4\times1.58)=87.0$ nm. Also, the AR film may be a layered film (a two-layered AR film) of a magnesium fluoride film having a thickness of 99.6 nm and an aluminum oxide film having a thickness of 87.0 nm. Note that material for the dielectric film may adopt material other than magnesium fluoride or aluminum oxide.

With the planar light emitting device of the present embodiment, the AR film is provided on at least one face of the second transparent substrate 21 in the thickness direction, preferably on both faces thereof, and it is thereby possible to reduce Fresnel loss and to improve the efficiency in light extraction.

Also, as another means for suppressing Fresnel loss, it is conceivable that a moth eye (moths' eyes) structure is provided on at least the first face side of the second transparent substrate 21 in the thickness direction. The moth eye structure has a two dimensional periodic structure in which minute tapered protuberances are arranged in a two dimensional array. Reflection preventing portions are constituted by multiple minute protuberances and media (for example, air) entering between adjacent minute protuberances. Here, in the case where the moth eye structure is formed by processing the second transparent substrate 21 with a nanoimprinting method, the refractive index of a minute protuberance is the same as that of the second transparent substrate 21. In this case, the effective refractive index of the reflection preventing portion continuously changes in the thickness direction of the reflection preventing portion between the refractive index of the second transparent substrate 21 (=1.51) and the refractive index of the medium (=1), and a state in which refractive index interface that causes Fresnel loss is not present is seemingly achieved. Therefore, as compared with the AR film, the moth eye structure is capable of reducing dependence on the wavelength or the incidence angle, and also capable of reducing reflectance. Note that although the height and the period of minute protuberances in the moth eye structure can be respectively set to 200 nm and 100 nm, these numerical values are merely examples, and do not particularly limit the present invention. Although the above-described moth eye structure can be formed by, for example, a nanoimprinting method, it may be formed by a method other than the nanoimprinting method (for example, a laser processing technique).

Also, the moth eye structure may be, for example, a moth eye non-reflective film available from Mitsubishi Rayon Co., Ltd.

However, the planar light emitting device of the present embodiment includes two organic EL elements 10 in a space enclosed by the second transparent substrate 21 and the protector 30, and these two organic EL elements 10 are arranged side by side on one plane parallel to the first surface of the second transparent substrate 21. Here, in the organic EL element module unit 1, the plan view shape of each of two organic EL elements 10 is a rectangular shape, the external form sizes of these two organic EL elements 10 are the same, and the two organic EL elements 10 are arranged side by side in the lateral direction of the organic EL element 10. Note that two organic EL elements 10 have not only the same external form size but also the same structure. In short, two organic EL elements 10 have the same specification.

Figure 5:
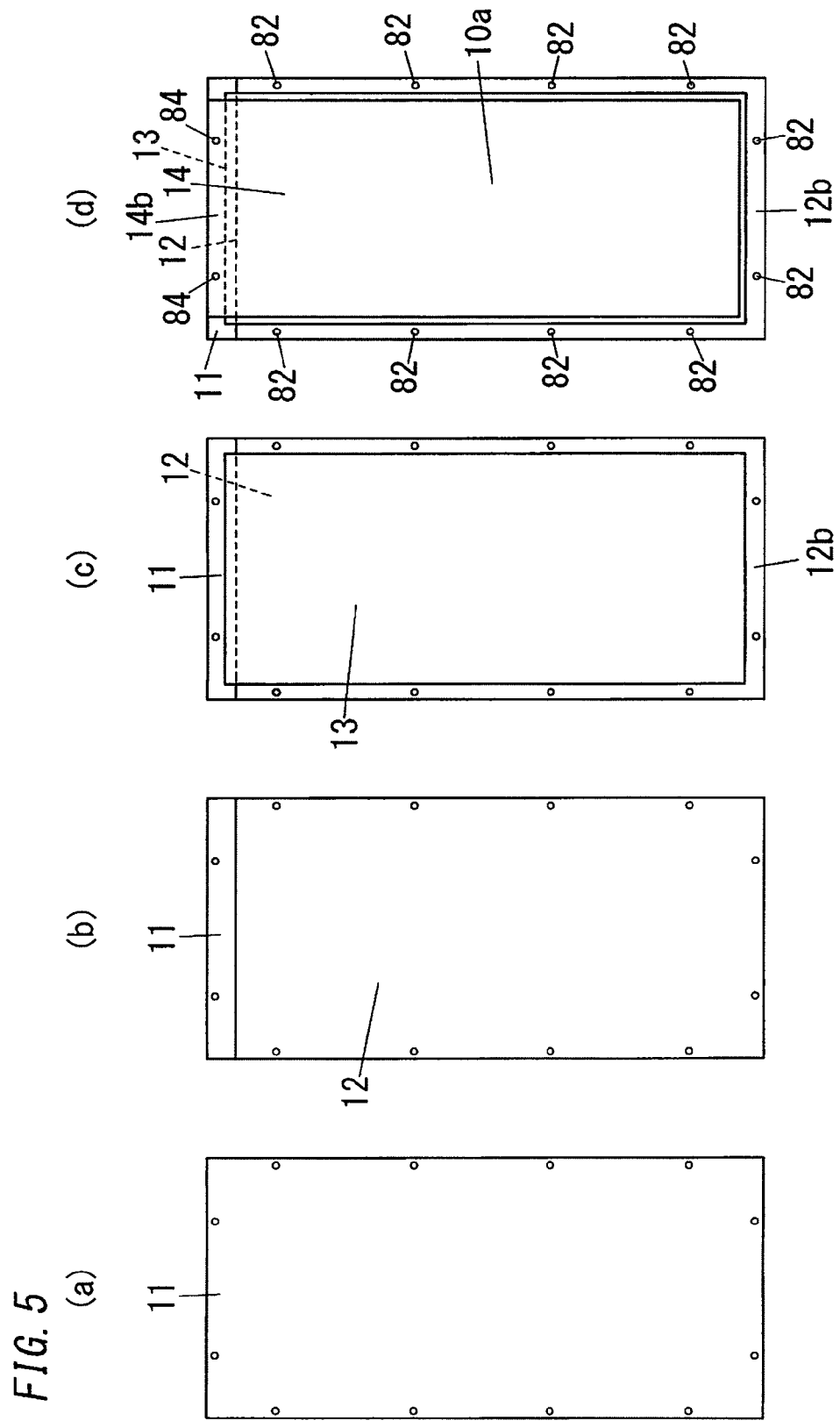
FIGS. 5(a)-5(d) are diagrams illustrating a layered structure of an organic EL element in the planar light emitting device above.

In the organic EL element 10, the plan view of the first transparent substrate 11 is a rectangular shape as shown in FIG. 5(*a*), and the anode 12 whose plan view is a rectangular shape in which only a first end portion of the first transparent substrate 11 in the longitudinal direction is exposed as shown in FIG. 5(*b*). Therefore, the dimension of the anode 12 in the lateral direction is the same as that of the first transparent substrate 11 in the lateral direction, and the dimension thereof in the longitudinal direction is shorter than that of the first transparent substrate 11 in the longitudinal direction. Also, in the organic EL element 10, the plan view shape of the organic EL layer 13 is a rectangular shape in which the dimensions of the organic EL layer 13 in the longitudinal direction and the lateral direction are each shorter than those of the first transparent substrate 11, as shown in FIG. 5(*c*). Also, in the organic EL element 10, the plan view shape of the cathode 14 is a rectangular shape in which the dimension of the cathode in the lateral direction is shorter than that of the organic EL layer 13 in the lateral direction and the dimension thereof in the longitudinal direction is shorter than that of the first transparent substrate 11 in the longitudinal direction, as shown in FIG. 5(*d*). Here, the cathode 14 is disposed such that a first end portion thereof in the longitudinal direction is formed on the first end portion of the first transparent substrate 11. Also, the dimension of the cathode 14 in the longitudinal direction is set such that the cathode 14 overlaps a first end portion of the organic EL layer 13 in the longitudinal direction on the first end portion side of the cathode 14 in the longitudinal direction, and a portion of the anode 12 formed on a second end portion of the first transparent substrate 11 in the longitudinal direction and a second end portion of the organic EL layer 13 in the longitudinal direction are exposed. Accordingly, the portion of the anode 12 formed on the second end portion of the first transparent substrate 11 in the longitudinal direction and the portion thereof formed on both end portions of the first transparent substrate 11 in the lateral direction are exposed, and these exposed portions constitute the above-described anode extension part 12*b*. Also, the portion of the cathode 14 formed on the first end portion of the first transparent substrate 11 in the longitudinal direction is exposed, and the exposed portion constitutes the above-described cathode extension part 14*b*. Also, the organic EL element 10 is formed into a line symmetrical shape with respect to a central line in the longitudinal direction in plan view. In other words, assuming that the lateral direction is a right-left direction, the organic EL element 10 has a right-left symmetrical shape.

Figure 6:
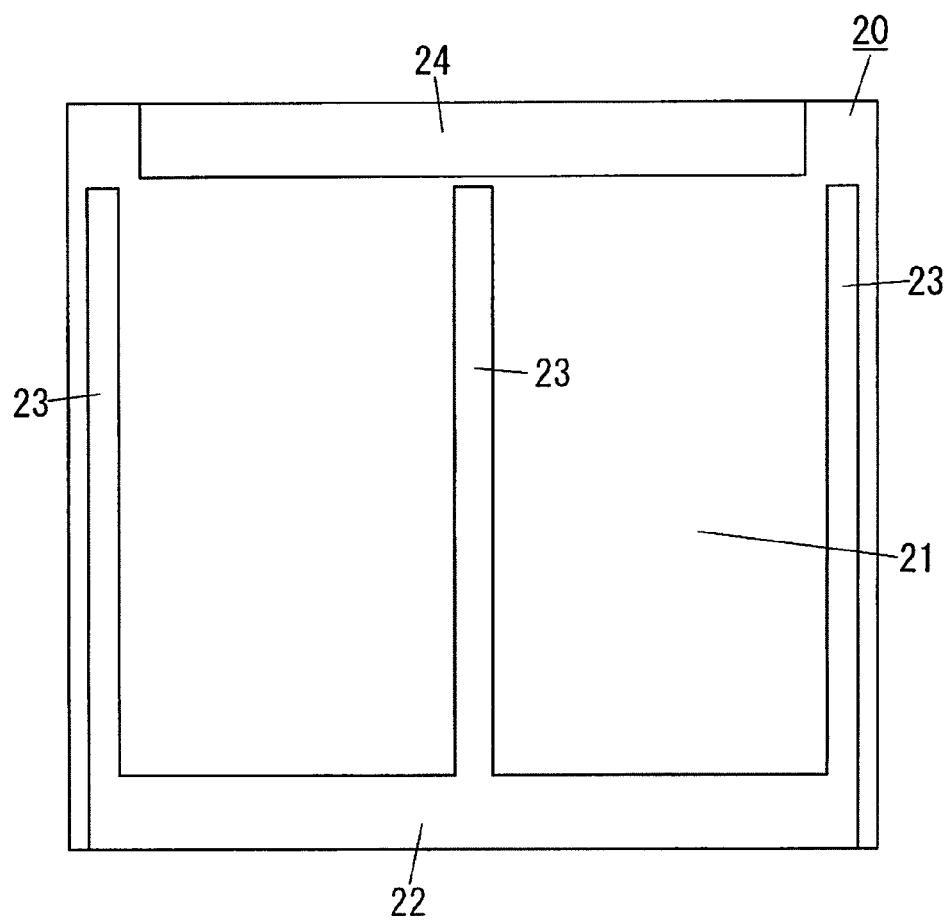
FIG. 6 is a schematic plan view of a base substrate in the planar light emitting device above.

Also, as described above, the external connection electrode 22 for receiving high potential, the external connection electrode 24 for receiving low potential and the auxiliary electrodes 23 are formed on the first surface of the second transparent substrate 21. In the base substrate 20, as shown in FIG. 6, the plan view shape of the second transparent substrate 21 is a rectangular shape, and the external connection electrode 22 for receiving high potential is formed along one side of two predetermined sides among four sides of the second transparent substrate 21, and the external connection electrode 24 for receiving low potential is formed along the other side. Here, the plan view shape of each of the external connection electrodes 22 and 24 is a strip shape. Note that in the example shown in FIG. 6, the external connection electrode 22 for receiving high potential is formed on one end portion of the first surface of the second transparent substrate 21 in the lateral direction, and the external connection electrode 24 for receiving low potential is formed on the other end portion thereof in the lateral direction.

Also, in the base substrate 20, three auxiliary electrodes 23 are electrically connected to the external connection electrode 22 for receiving high potential. Here, each of the auxiliary electrodes 23 is integrally formed so as to be continuous with the external connection electrode 22. Also, the auxiliary electrodes 23 are each formed into a shape elongated along the longitudinal direction that connects the external connection electrodes 22 and 24 on a plane parallel to the first surface of the second transparent substrate 21, and are arranged side by side in a direction orthogonal to the longitudinal direction on the same plane. Here, a middle auxiliary electrode 23 in the right-left direction of FIG. 6 among three auxiliary electrodes 23 is disposed so as to overlap portions that are adjacent to each other of the anode extension parts 12*b* of each of two organic EL elements 10 in FIG. 3. Also, an auxiliary electrode 23 on the left side in the right-left direction in FIG. 6 is disposed so as to overlap a portion of the anode extension part 12*b* of the organic EL element 10 on the left side in FIG. 3 that is formed along the longitudinal direction of the organic EL element 10 on the left side of the light emitting portion 10*a*. Also, an auxiliary electrode 23 on the right side in the right-left direction in FIG. 6 is disposed so as to overlap a portion of the anode extension part 12*b* of the organic EL element 10 on the right side in FIG. 3 that is formed along the longitudinal direction of the organic EL element 10 on the right side of the light emitting portion 10*a*. Here, the width dimension of the auxiliary electrode 23 is set to be longer than that of the anode extension part 12*b*. However, each of the auxiliary electrodes 23 is disposed so as to avoid a projection region of each light emitting portion 10*a* in the organic EL element module unit 1, onto the second transparent substrate 21.

The external connection electrodes 22 and 24 may be formed by, for example, a plating method, a sputtering method, a printing method, or the like. Here, in the case where the external connection electrode 22 and 24 are formed by a plating method, it is preferable to adopt, for example, PdNiAu or the like as material for the external connection electrode 22 and 24. Also, in the case where the external connection electrode 22 and 24 are formed by a sputtering method, for example, MoAl, CrAg, AgPdCu (APC) or the like may be adopted as material for the external connection electrode 22 and 24. Moreover, in the case where the external connection electrodes 22 and 24 are formed by a printing method, for example, silver may be adopted as material for the external connection electrodes 22 and 24. Note that in the case where material for the external connection electrodes 22 and 24 is silver and the external connection electrodes are formed by a printing method, it is possible to use silver paste (for example, QMI516E available from Henkel AG & Co. KGaA, or the like).

Portions of the external connection electrodes 22 and 24 are joined to the protector 30, and remaining portions thereof are exposed outside a package constituted by the base substrate 20 and the protector 30. Therefore, the planar light emitting device of the present embodiment has a structure in which power can be supplied to the organic EL element module unit 1 from the outside via the external connection electrodes 22 and 24.

As material for the auxiliary electrodes 23, the same material as that for the external connection electrodes 22 and 24 is adopted. Accordingly, as compared with a case where material for the anode 12 is transparent conductive material such as ITO, the planar light emitting device can reduce the specific electrical resistance of the material for the auxiliary electrode 23, and is capable of making the sheet resistance of the auxiliary electrode 23 smaller than that of the anode 12.

The organic EL element 10 includes ten first through hole wires 92 and two second through hole wires 94 that have been described above. Here, in the organic EL element 10, among ten first through hole wires 92, two first through hole wires 92 disposed on the external connection electrode 22 for receiving high potential of the base substrate 20 are electrically connected to this external connection electrode 22 for receiving high potential via connection portions 62. Also, in the organic EL element 10, among ten first through hole wires 92, four first through hole wires 92 disposed on each of two auxiliary electrodes 23 are electrically connected to the auxiliary electrode 23 via connection portions 63. The first through hole wires 92, the connection portions 62 and the connection portions 63 are made of conductive paste (for example, silver paste or the like). Also, in the organic EL element 10, two second through hole wires 94 disposed on an external connection electrode 24 for receiving low potential in the base substrate 20 are electrically connected to the external connection electrode 24 via connection portions 64. The second through hole wires 94 and the connection portions 64 are formed with conductive paste (for example, silver paste or the like). Note that the number of first through hole wires 92 and the number of second through hole wires 94 are merely examples, and do not limit the present invention.

As can be understood from the above description, in the planar light emitting device of the present embodiment, two organic EL elements 10 are connected in parallel. Therefore, the planar light emitting device is capable of causing each organic EL element 10 to emit light by applying an appropriate voltage, from a direct-current power supply, between the external connection electrode 22 for receiving high potential and the external connection electrode 24 for receiving low potential.

Hereinafter, a method for preparing the planar light emitting device will now be described with reference to FIGS. 7 and 8.

First, after the light extraction structure portion 50 is formed on the second surface side of the first transparent substrate 11, the anode 12, the organic EL layer 13 and the cathode 14 are formed in order on the first surface side of the first transparent substrate 11 to form the basic structure of the organic EL element 10, and thereby the structure shown in FIGS. 7(a) and 8(a) is obtained. Here, to form the anode 12, for example, it is sufficient that a conductive film (for example, ITO film or the like) that serves as the base of the anode 12 is formed by a sputtering method and subsequently the conductive film is patterned with a photolithography technique and an etching technique. However, depending on material for the anode 12, the conductive film may be formed by a vacuum vapor deposition method or the like instead of a sputtering method. Also, the organic EL layer 13 and the cathode 14 may be sequentially formed into films by, for example, a vacuum vapor deposition method, or the like.

After the above-described cathode 14 is formed, first through holes 82 and second through holes 84 are formed in the basic structure of the above-described organic EL element 10 to obtain the structure shown in FIGS. 7(b) and 8(b). Here, as a method for forming the first through holes 82 and the second through holes 84, for example, punching, thermal processing or the like can be adopted. Here, as a processing machine for performing punching, for example, a film puncher can be used. Also, as a processing machine for performing thermal processing, for example, a perforator or the like can be used. Note that until the formation of the first through holes 82 and the second through holes 84 completes, a plastic substrate from which many first transparent substrates 11 can be obtained may be used, and each organic EL element 10 may be separated after formation of the first through holes 82 and the second through holes 84. Note that the above-described light extraction structure portion 50 may be formed after the formation of the first through holes 82 and the second through holes 84.

Figure 8:
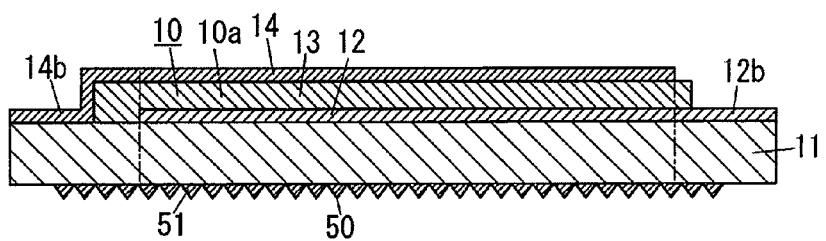
FIGS. 8(a)-8(d) show sectional views corresponding to main steps for illustrating a method for preparing the planar light emitting device above.
Figure 8:
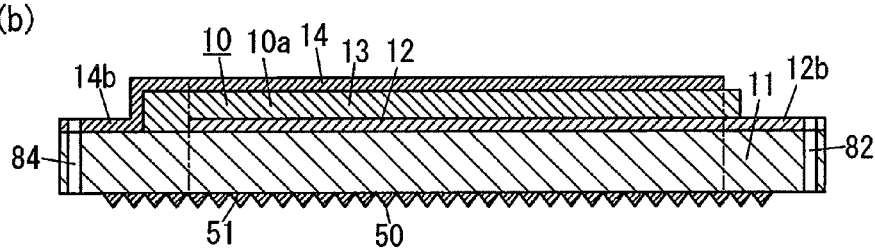
Figure 8:
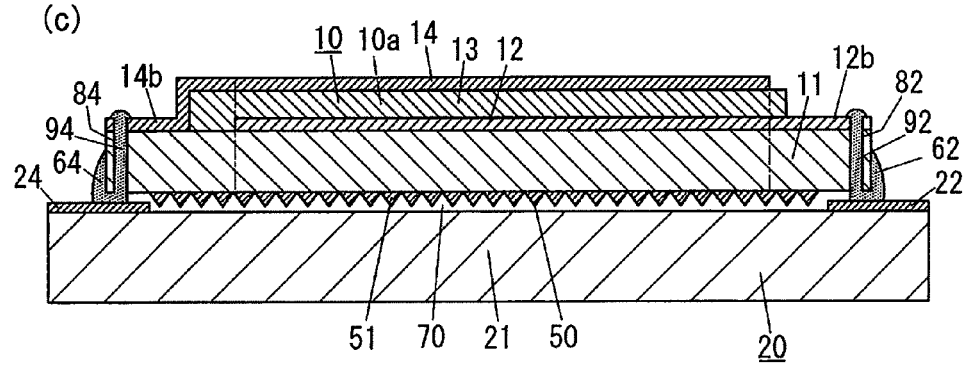
Figure 8:
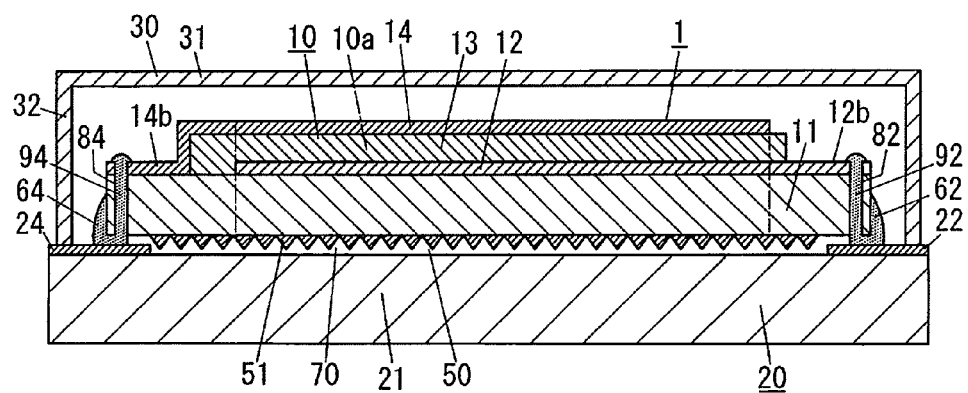
Figure 9:
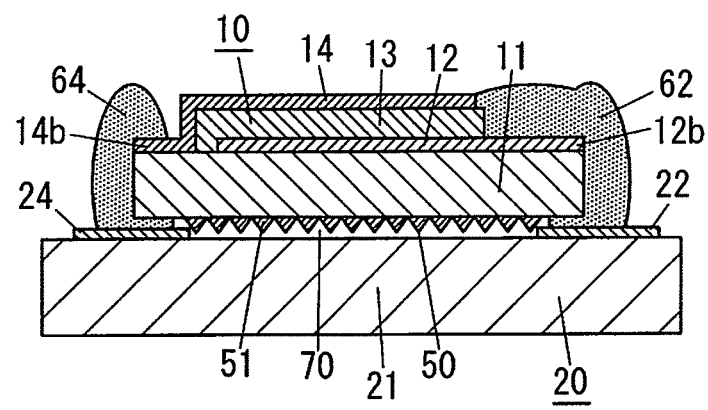
FIG. 9 is a diagram illustrating a comparative example of the planar light emitting device above.

After obtaining the structure shown in FIGS. 7(b) and 8(b) described above, each organic EL element 10 is mounted on the base substrate 20 to obtain the structure shown in FIGS. 7(c) and 8(c). When the organic EL element 10 is mounted, conductive paste is applied to (used to fill) the inside of each first through hole 82 to form each first through hole wire 92, and conductive paste is applied to form the connection portions 62 and 63, and thereby the anode 12 is electrically connected to the external connection electrode 22 for receiving high potential. Also, conductive paste is applied to (used to fill) the inside of each first through hole 84 to form each second through hole wire 94, and conductive paste is applied to form each connection portion 64, and thereby the cathode 14 is electrically connected to the external connection electrode 24 for receiving low potential. Here, using a dispenser as means for applying conductive paste can improve the precision in the application amount, and moreover, applying conductive paste to the inside of the first through holes 82 and the inside of the second through holes 84 can reduce the application amount. Accordingly, it is possible to reduce the width of the anode extension part 12b (the width of a portion of the anode 12 that is exposed) and the width of the cathode extension part 14b (the width of a portion of the cathode 14 that is exposed on the base substrate 20) of the organic EL element 10. Here, in the configuration of a comparative example in which the first through hole wires 92 and the second through hole wires 94 are not provided (see FIG. 9), it is necessary that the connection portion 62 that electrically connects the anode extension part 12b and the external connection electrode 22 is formed so as to extend over the surface of the anode extension part 12b, the side face of the first transparent substrate 11 and the surface of the external connection electrode 22, and the connection portion 64 that electrically connects the cathode extension part 14b and the external connection electrode 24 is formed so as to extend over the surface of the cathode extension part 14b, the side face of the first transparent substrate 11 and the surface of the external connection electrode 24. Accordingly, the application amount of conductive paste for forming the connection portions 62 and 64 is increased, and for example, as shown in FIG. 9, possibility increases that the anode extension part 12b and the cathode 14 cause a short circuit due to the connection portion 62. Also, with this comparative example, it is necessary that the connection portion (not shown) that electrically connects the anode extension part 12b and the auxiliary electrode (not shown) is formed so as to extend over the surface of the anode extension part 12b, the side face of the first transparent substrate 11 and the surface of the auxiliary electrode, and therefore possibility increases that the anode extension part 12*b* and the cathode 14 cause a short circuit via the connection portion. Also, with the comparative example, open-circuit failure may occur due to discontinuity arising from the step coverage of the connection portions 62 and 64, or driving voltage may increase due to an increase in the resistance values of the connection portions 62 and 64. Moreover, since the linear expansion coefficients of the first transparent substrate 11, the second transparent substrate 21 and the connection portions 62 and 64 are different from one another, with the comparative example shown in FIG. 9, the connection portions 62 and 64 may crack due to thermal stress resulting from an increase/decrease in the temperature when the planar light emitting device is used. In contrast, with the present embodiment, it is possible to reduce the application amount of conductive paste. Hence, the possibilities of the occurrence of the above-described short-circuit or open-circuit failure can be reduced, and the producing yield can be improved.

Figure 7:
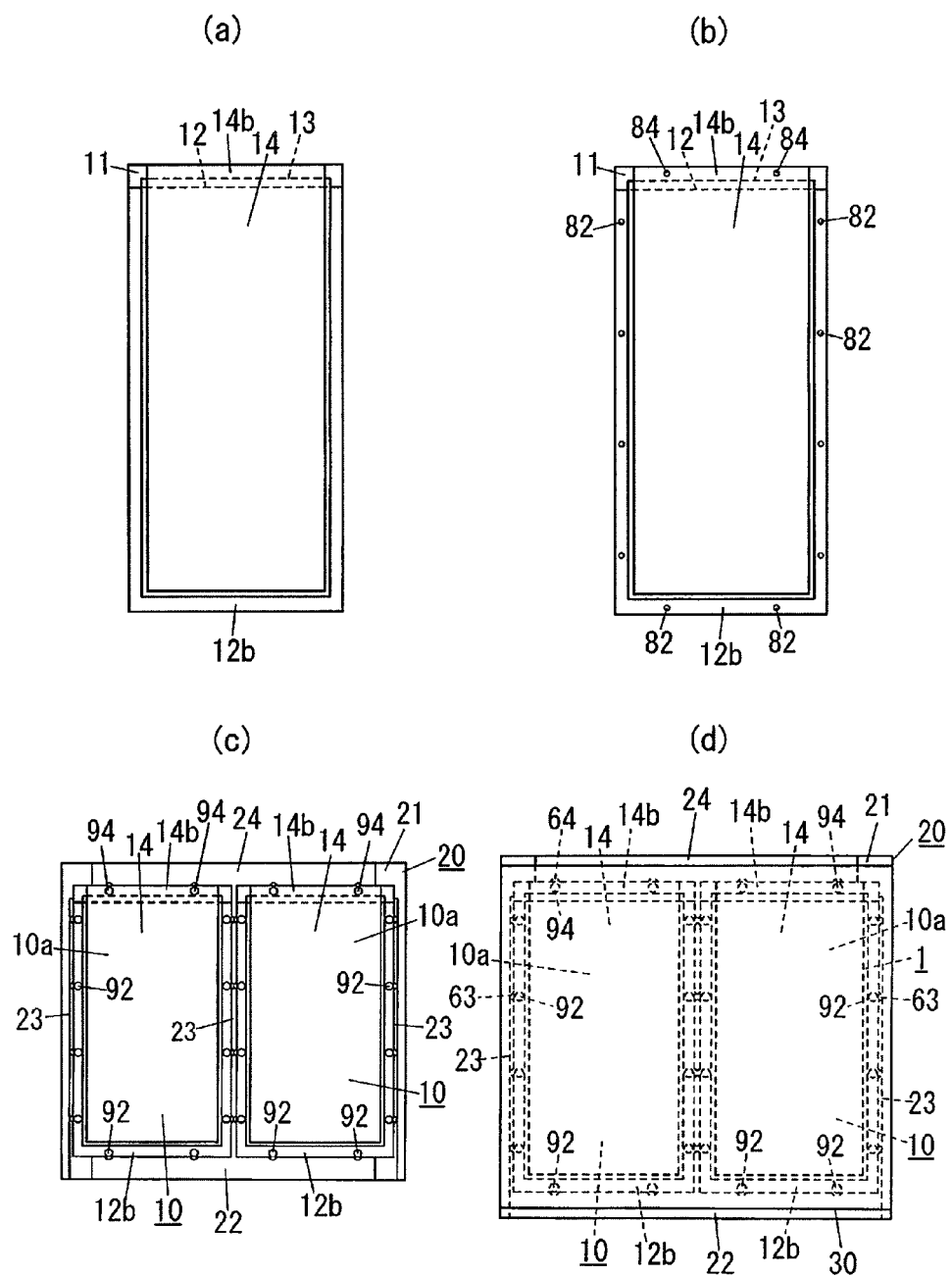
FIGS. 7(a)-7(d) show plan views corresponding to main steps for illustrating a method for preparing the planar light emitting device above.

After obtaining the structure shown in FIGS. 7(*c*) and 8(*c*) described above, the protector 30 is joined to the base substrate 20 to obtain a planar light emitting device having the structure shown in FIGS. 7(*d*) and 8(*d*). Note that the protector 30 is joined to the base substrate 20 by joining the entire periphery of the face of the frame portion 32 facing the base substrate 20 to the base substrate 20. Therefore, the protector 30 is joined to the base substrate 20 to seal the organic EL element module unit 1.

The planar light emitting device of the present embodiment includes the above-described organic EL element module unit 1, the second transparent substrate 21 and the protector 30, and the organic EL element 10 of the organic EL element module unit 1 has the above-described light emitting portion 10*a*, first through hole wires 92 and second through hole wires 94, and the external connection electrodes 22 and 24 are disposed on the first surface side of the second transparent substrate 21 to avoid a projection region of the light emitting portion 10*a*. Thus, with the planar light emitting device of the present embodiment, it is possible to reduce the distance between the light emitting portions 10*a* of adjacent organic EL elements 10 and the area of non-light emitting portion dependent on this distance, and to reduce luminance unevenness and to improve the design (the design in a state in which the device is driven so that the light emitting portions 10*a* emit light) while increasing the size and service life of the light emitting area. Note that with the planar light emitting device of the present embodiment, the anode extension parts 12*b* of adjacent organic EL elements are electrically connected with the first through hole wires 92 and the connection portions 63 formed on the first face side of both organic EL elements 10, and it is thereby possible to arrange organic EL elements 10 side by side without providing a space between the adjacent organic EL elements 10.

Figure 10:
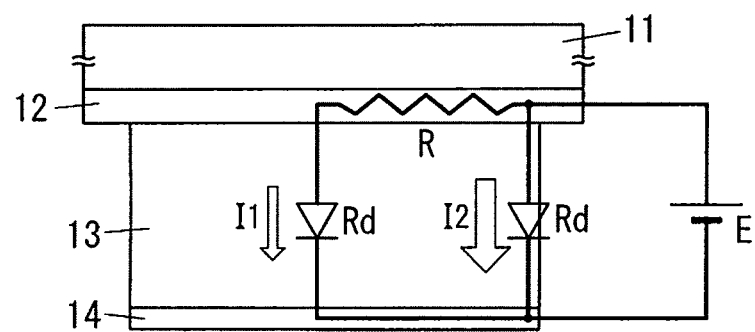
FIG. 10 is a diagram illustrating a comparative example of the planar light emitting device above.

Incidentally, in the organic EL element 10 in which the anode 12 is made of a transparent conductive film such as an ITO film or the like, the sheet resistance of the anode 12 is larger than that of the cathode 14 made of a metal film. Accordingly, in the case where the auxiliary electrode 23 is not present, if the area of the light emitting portion 10*a* is increased, a potential gradient at the anode 12 increases, and the voltage applied to the organic EL layer 13 between the anode 12 and the cathode 14 increases, which lead to an increase in luminance unevenness as well as decreases in the efficiency and the service life. Here, as shown in FIG. 10, when a current flowing at a first position (a small region) in the vicinity of the external connection electrode 22 for receiving high potential described above in the organic EL layer 13 is denoted by I2, a current flowing at a second position (a small region) far away from the external connection electrode 22 in the organic EL layer 13 is denoted by I1, a resistance from the first position to the second position in the anode 12 is denoted by R, and a resistance of the organic EL layer 13 at the first position and the second position is denoted by Rd, $I1/I2 \approx Rd/(Rd+R)$.

In short, in-plane variation in the current density of the current flowing into the organic EL element 10 occurs due to a drop in the voltage of the anode 12, and therefore luminance unevenness increases in the case of increasing the size of the area. Note that ideally, when precision R=0, I1=I2 and uniformity is 100%.

In contrast, the planar light emitting device of the present embodiment is provided with the above-described auxiliary electrodes 23, and therefore it is possible to reduce luminance unevenness. Also, the planar light emitting device of the present embodiment is provided with the auxiliary electrodes 23, and thus it is possible to suppress current crowding in the organic EL element when it is driven, as a result of which the service life is further increased. Here, in the planar light emitting device of the present embodiment, the auxiliary electrodes 23 are disposed so as to avoid projection regions of the light emitting portions 10*a* the first surface of the second transparent substrate 21, and therefore it is possible to prevent a depreciation of the design resulting from the auxiliary electrodes 23.

Note that the number of organic EL elements 10 in the planar light emitting device is not particularly limited. Also, the number of auxiliary electrodes 23 may be appropriately changed in accordance with the number of organic EL elements 10.

Example 1

In an organic EL element 10 in the planar light emitting device of the present example, in the configuration of Embodiment 1 shown in FIG. 1, the organic EL layer 13 between the anode 12 and the cathode 14 has a structure in which the hole transport layer 133, the light emitting layer 134, the electron transport layer 135 and the electron injection layer 136 are stacked.

For preparing the organic EL element 10 of the planar light emitting device of the present example, first, the light extraction structure portion 50 was formed on the second surface side of the first transparent substrate 11 made of a PET substrate by an imprinting method, and thereafter the ITO film having a film thickness of 100 nm was formed on the first surface side of the first transparent substrate 11 by a sputtering method. Next, after a positive resist (OFPR800LB available from TOKYO OHKA KOGYO CO., Ltd.) was applied to the entire face on the first surface side of the first transparent substrate 11 by a spin coating method, baking was performed. Subsequently, ultraviolet exposure was performed using a glass mask prepared separately and a portion of the resist exposed to light was removed by a developer (NMD-W available from TOKYO OHKA), and thereby patterning was performed on the resist. Thereafter, the resist was used as a mask to form the anode 12 made of the ITO film that was patterned by etching a portion of the ITO film that was not covered by the resist with etchant (ITO-06N available from Kanto Chemical Co., Inc.). Subsequently, the resist was stripped with a resist stripping solution (a stripping solution 106 available from TOKYO OHKA KOGYO CO., Ltd.). Note that as conditions for formation of the ITO film by a sputtering method, an ITO target was used as a target and a film formation temperature was set to 100° C.

The first transparent substrate 11 on which the above-described anode 12 was formed was subjected to ultrasonic cleaning for ten minutes each using neutral detergent and pure water, and thereafter it was dried at a predetermined drying temperature (80° C.) in vacuo for a predetermined drying period of time (two hours), and then it was subjected to surface cleaning treatment for a predetermined period of time (ten minutes) with ultraviolet rays (UV) and ozone ($O_3$).

Thereafter, the first transparent substrate 11 was disposed inside a chamber of a vacuum vapor deposition device, α-NPD was formed into a film as the hole transport layer 133 having a film thickness of 40 nm. Subsequently, on this hole transport layer, the light emitting layer 134 having a film thickness of 40 nm was formed into a film in which aluminum-tris[8-hydroxyquinoline] (hereinafter, simply referred to as $Alq_3$) was doped with 5% of rubrene. Subsequently, on this light emitting layer, Alga was formed into a film as the electron transport layer 135 having a film thickness of 40 nm. Thereafter, on the electron transport layer, lithium fluoride (LiF) was formed into a film as the electron injection layer 136 having a film thickness of 1 nm, and then aluminum was formed into a film as the cathode 14 having a film thickness of 80 nm.

After the above-described organic EL element 10 was produced, the first through holes 82 and the second through holes 84 were formed, and then solvent-free conductive paste (here, TB3380 available from ThreeBond Co., Ltd.) capable of being cured at a lower temperature than the heat resistant temperature of the organic EL element 10 was applied by a dispenser and two organic EL elements 10 and the base substrate 20 were joined to form the connection portions 62, 63 and 64. At this time, the same solvent-free conductive paste was applied to the inside of the first through holes 82 and the inside of the second through holes 84 to form the first through hole wires 92 and the second through hole wires 94. Curing the conductive paste was performed at 100° C.

Thereafter, the protector 30 made of a glass substrate was prepared, and the protector 30 and the second transparent substrate 21 were joined via a joint portion made of an ultraviolet curable resin. Accordingly, two organic EL elements 10 of the organic EL element module unit 1 are sealed with the base substrate 20 in which the external connection electrodes 22 and 24 are formed on the first surface of the second transparent substrate 21 made of a glass substrate and the protector 30 made of a glass substrate, and therefore it is not necessary to separately form a waterproof barrier layer.

As described above, the planar light emitting device includes the organic EL element module unit 1, the second transparent substrate 21, and the protector 30. The organic EL element module unit 1 includes plural organic EL elements 10. The organic EL element 10 includes a first transparent substrate 11, an anode 12, a light emitting layer 134, and a cathode 14. The anode 12, the light emitting layer 134 and the cathode 14 are provided on the first surface side of the first transparent substrate 11. The second transparent substrate 21 is disposed on a light extraction side of the organic EL element module unit 1. The protector 30 encloses, together with the second transparent substrate 21, the organic EL element module unit 1. The first transparent substrate 11 has a thickness, and thus the first transparent substrate 11 has a thickness direction.

The organic EL element 10 includes a light emitting portion 10a, first through hole wires 92 and second through hole wires 94. In the light emitting portion 10a, the first transparent substrate 11, the anode 12, the light emitting layer 134, and the cathode 14 overlap in the thickness direction of the first transparent substrate 11. The first through hole wire 92 is formed inside the first through hole 82 that penetrates a first part of the anode 12 and the first transparent substrate 11. The first part is a portion formed outside the light emitting portion 10a of the anode 12. The first through hole wire 92 is electrically connected to the anode 12. The second through hole wire 94 is formed inside the second through hole 84 that penetrates a second part of the cathode 14 and the first transparent substrate 11. The second part is a portion that extends on the first surface of the first transparent substrate 11 of the cathode 14. The second through hole wire 94 is electrically connected to the cathode 14.

The planar light emitting device includes an external connection electrode 22. The external connection electrode 22 includes an external connection electrode 22 for receiving high potential which serves to supply power to the organic EL element module unit 1 and an external connection electrode 22 for receiving low potential which serves to supply power to the organic EL element module unit 1.

The external connection electrode 22 is disposed on the first surface side of the second transparent substrate 21 so as to avoid a projection region of the light emitting portion 10a.

Note that the projection region of the second transparent substrate 21 is defined as a portion overlaid with the light emitting portion 10a in the thickness direction of the first transparent substrate 11.

In other words, the external connection electrode 22 is displaced from the light emitting portion 10a in a direction intersecting the thickness direction of the first transparent substrate 11. Thus, the light emitting portion 10a does not overlap the external connection electrode 22 in the thickness direction of the first transparent substrate 11.

Also, the planar light emitting device includes the auxiliary electrodes 23 disposed on the first surface side of the second transparent substrate 21 so as to be overlapped with the first part, the auxiliary electrodes being electrically connected to the first part, and the auxiliary electrodes being made of material having a smaller specific electrical resistance than that of the anode 12.

Embodiment 2

Figure 11:
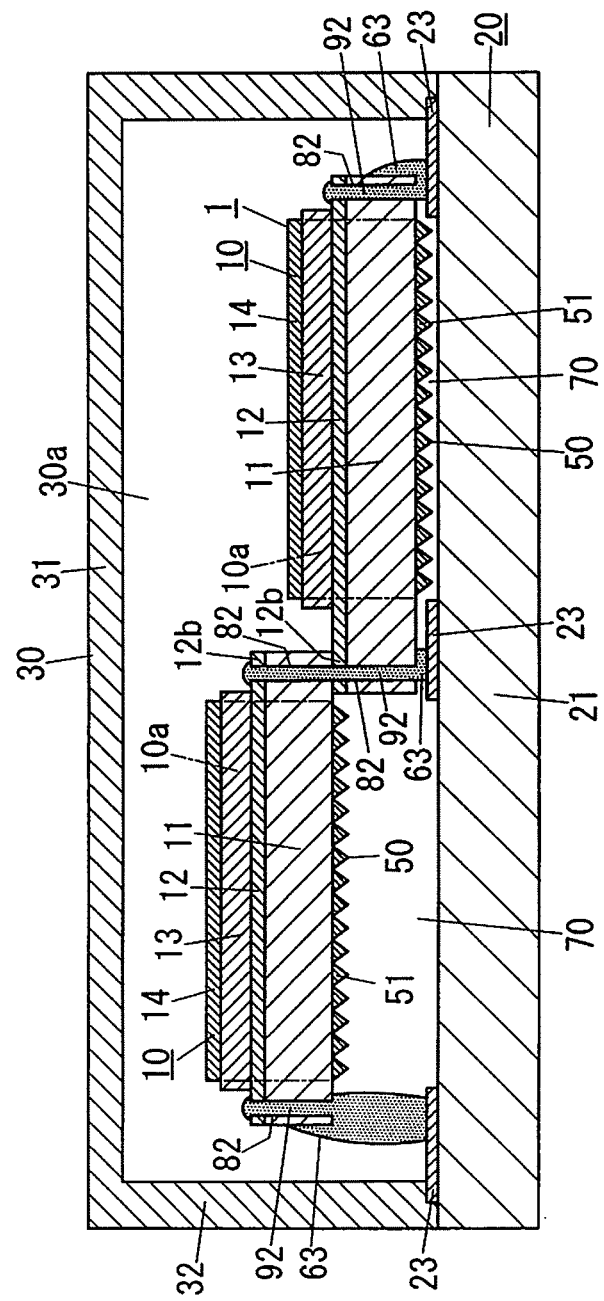
FIG. 11 is a schematic cross-sectional view of a planar light emitting device of Embodiment 2.
Figure 12:
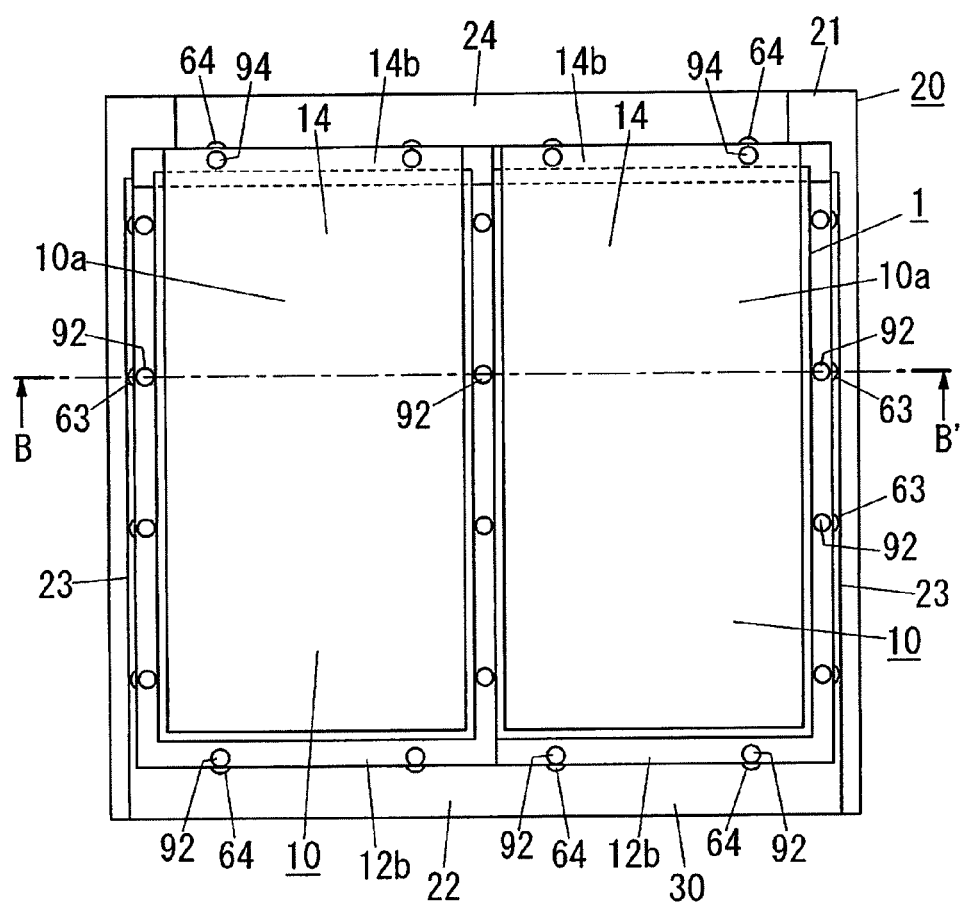
FIG. 12 is a schematic plan view of the planar light emitting device above in a state in which a protector is detached from the planar light emitting device.

Hereinafter, a planar light emitting device of the present embodiment will now be described based on FIGS. 11 and 12.

The basic configuration of the planar light emitting device of the present embodiment is approximately the same as that of Embodiment 1, and Embodiment 2 is different from Embodiment 1 in the structure of the organic EL element module unit 1 and the like. Note that the same reference numerals are given to constituent elements similar to Embodiment 1 and description thereof will be omitted.

In an organic EL element module unit 1 in the present embodiment, adjacent organic EL elements 10 are disposed so as to partially overlap. Specifically, portions (end portions of the organic EL elements 10 in the lateral direction that are located outside the light emitting portions 10a) of adjacent organic EL elements 10 are overlapped such that anode extension parts 12b of the adjacent organic EL elements 10 overlap in the thickness direction. Accordingly, in the planar light emitting device of the present embodiment, the anode extension part 12b located away from the base substrate 20 is electrically connected to the auxiliary electrode 23 via two first through hole wires 92 continuous in the thickness direction in the overlapped portions of the adjacent organic EL elements 10.

Therefore, in the planar light emitting device of the present embodiment, adjacent organic EL elements 10 are disposed so as to partially overlap, and therefore as compared with Embodiment 1, the area of a non-light emitting portion formed between adjacent organic EL elements 10 can be reduced.

Embodiment 3

Figure 13:
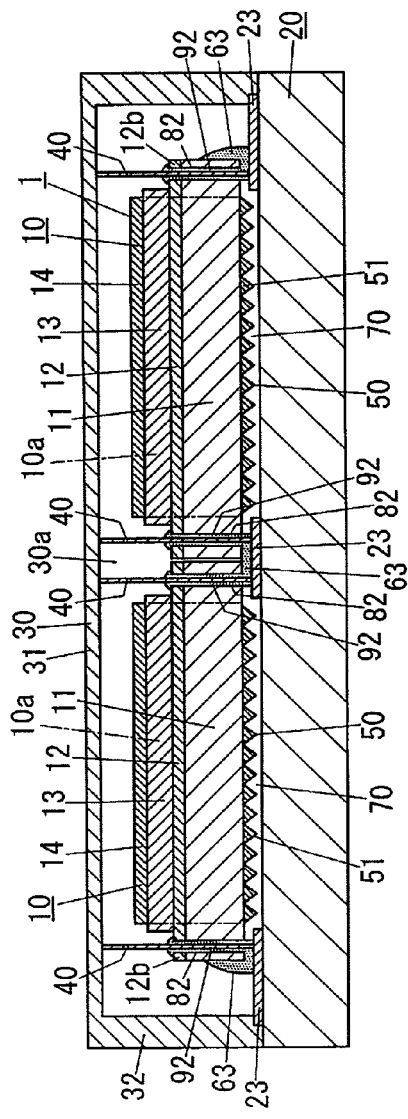
FIG. 13 is a schematic cross-sectional view of a planar light emitting device of Embodiment 3.

Hereinafter, a planar light emitting device of the present embodiment will now be described based on FIG. 13.

The basic configuration of the planar light emitting device of the present embodiment is approximately the same as that of Embodiment 1, and Embodiment 3 is different from Embodiment 1 in that plural spacers 40 each formed into a cylindrical-shape that are interposed between a base substrate 20 and a rear plate portion 31 of a protector 30 are provided. Note that the same reference numerals are given to constituent elements similar to Embodiment 1 and description thereof will be omitted.

Incidentally, in the planar light emitting device of the present embodiment, similarly to Embodiment 1, glass substrates are used for the second transparent substrate 21 and the protector 30. However, generally, the glass substrates are likely to undergo bending (warping) if the planar size thereof is increased. Thus, in the case where the size of the planar light emitting device is increased, there is possibility that a space that accommodates the organic EL element 10 between the base substrate 20 and the rear plate portion 31 is not secured, or the reliability decreases.

In contrast, the planar light emitting device of the present embodiment includes the above-described cylindrical-shaped spacers 40, and therefore it is possible to increase the size thereof.

Also, the spacers 40 are inserted into the first through holes 82. Thus, with the planar light emitting device of the present embodiment, the area of the light emitting portion 10a is not reduced due to the spacers 40, and it is possible to prevent the area of the non-light emitting portion from increasing due to the spacers 40. The number of spacers 40 may be the same as that of first through holes 82, or may be smaller than that of first through holes 82. In short, the number of spacers 40 and the number of first through holes 82 can be appropriately set in accordance with the planar size of the planar light emitting device. Also, spacers 40 may be inserted into the second through holes 84.

It is preferable to use the spacers 40 that are formed by electrically conductive material and are rigid. As such type of electrically conductive material, for example, copper, aluminum, nickel, silver and the like may be adopted. The spacers 40 may be inserted into the first through hole 82 or the second through hole 84 before conductive paste is applied to the first through holes 82 or the second through hole 84, or may be inserted thereto after conductive paste is applied to the first through holes 82 or the second through hole 84.

Incidentally, spacers 40 described in the present embodiment may be provided in the planar light emitting device of Embodiment 2.

Embodiment 4

Figure 14:
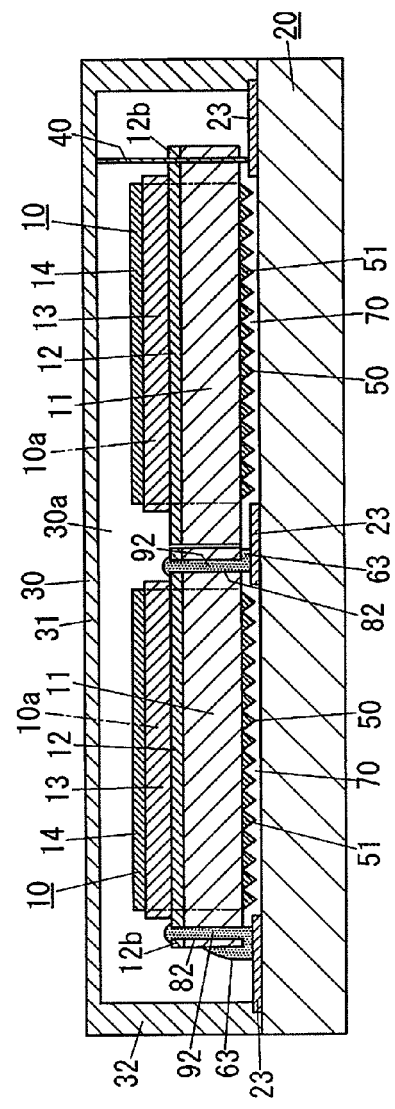
FIG. 14 is a schematic cross-sectional view of a planar light emitting device of Embodiment 4 as well as a schematic cross-sectional view taken along C-D' in FIG. 15.
Figure 15:
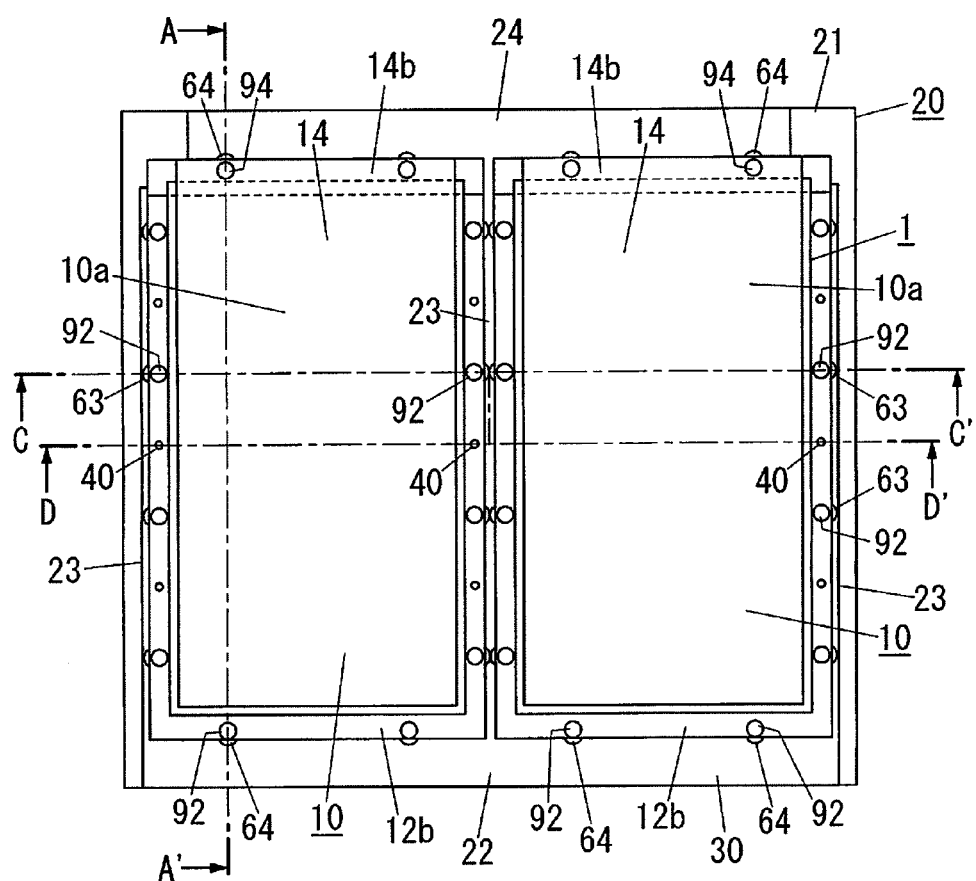
FIG. 15 is a schematic plan view of the planar light emitting device above in a state in which a protector is detached from the planar light emitting device.
Figure 16:
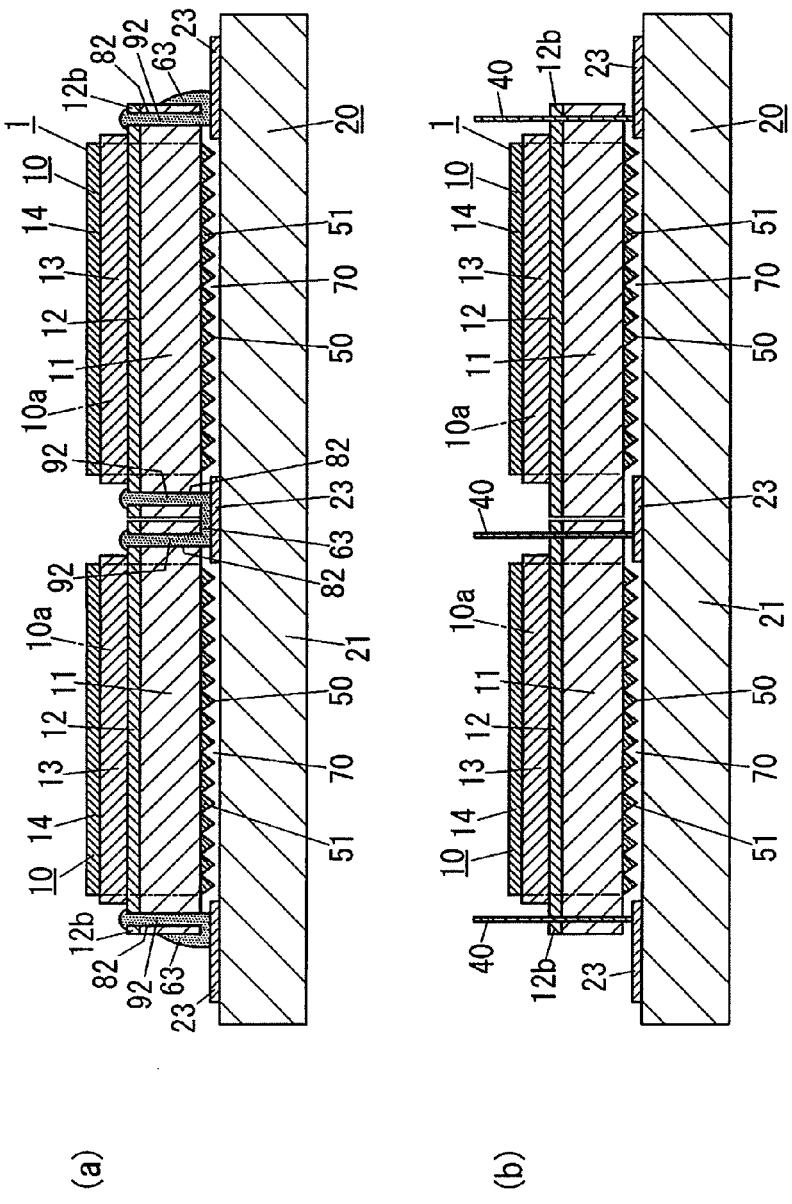
FIGS. 16(a) and 16(b) relate to a state in which the protector is detached from the planar light emitting device above, and shows (a) a schematic cross-sectional view taken along C-C' in FIG. 15 and (b) a schematic cross-sectional view taken along D-D' in FIG. 15.

Hereinafter, a planar light emitting device of the present embodiment will now be described based on FIGS. 14 to 16.

The basic configuration of the planar light emitting device of the present embodiment is approximately the same as that of Embodiment 3, and Embodiment 4 is different from Embodiment 3 in the arrangement of spacers 40. Note that the same reference numerals are given to constituent elements similar to Embodiment 3 and description thereof will be omitted.

Spacers 40 in the present embodiment each penetrate the first transparent substrate 11 at positions that avoid the first through holes 82, the second through holes 84 and the light emitting portions 10a, and are interposed between the base substrate 20 and the rear plate portion 31.

Figure 17:
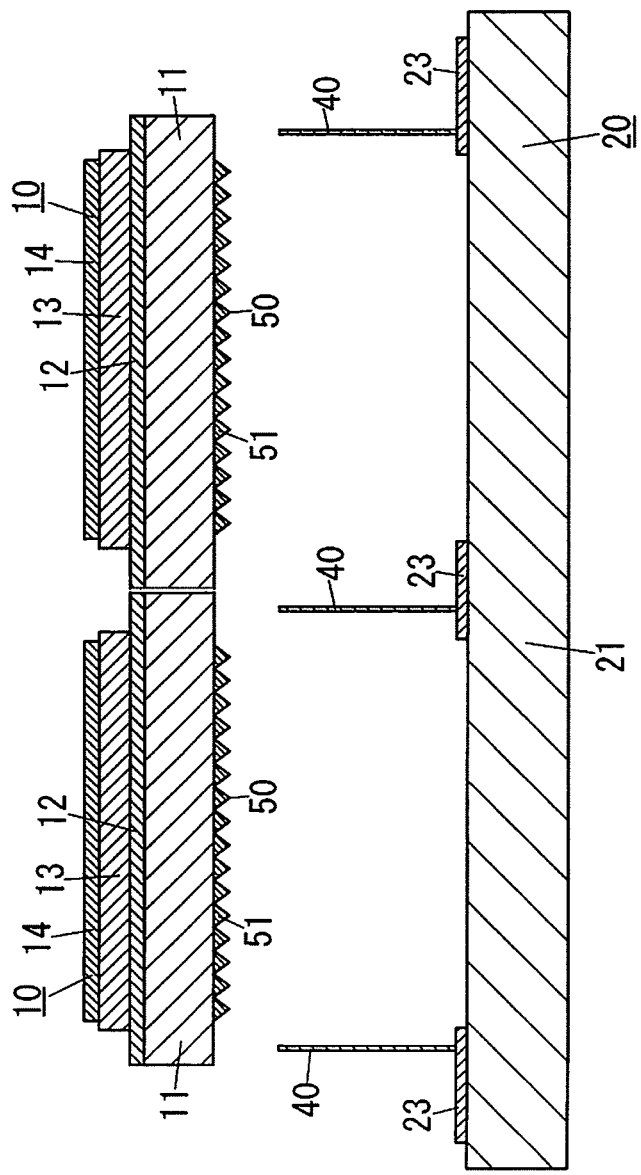
FIG. 17 is a diagram illustrating a method for preparing the planar light emitting device above.

Each spacer 40 is a needle pin, and has a pointed tip portion on the side of the rear plate portion 31. Here, as shown in FIG. 17, each spacer 40 is provided on the base substrate 20 before the organic EL elements 10 are mounted on the base substrate 20, and may be inserted into the organic EL element 10 when the organic EL elements 10 are mounted on the base substrate 20. Accordingly, the spacers 40 each have a function of temporarily holding the organic EL elements 10 until conductive paste is cured when the organic EL elements 10 are mounted on the base substrate 20.

Note that as a method for fixing spacers 40 to the base substrate 20, for example, an adhesive, an insulative double sided tape or the like may be used.

Incidentally, the spacers 40 described in the present embodiment may be provided in the planar light emitting device of Embodiment 2.

Embodiment 5

Figure 18:
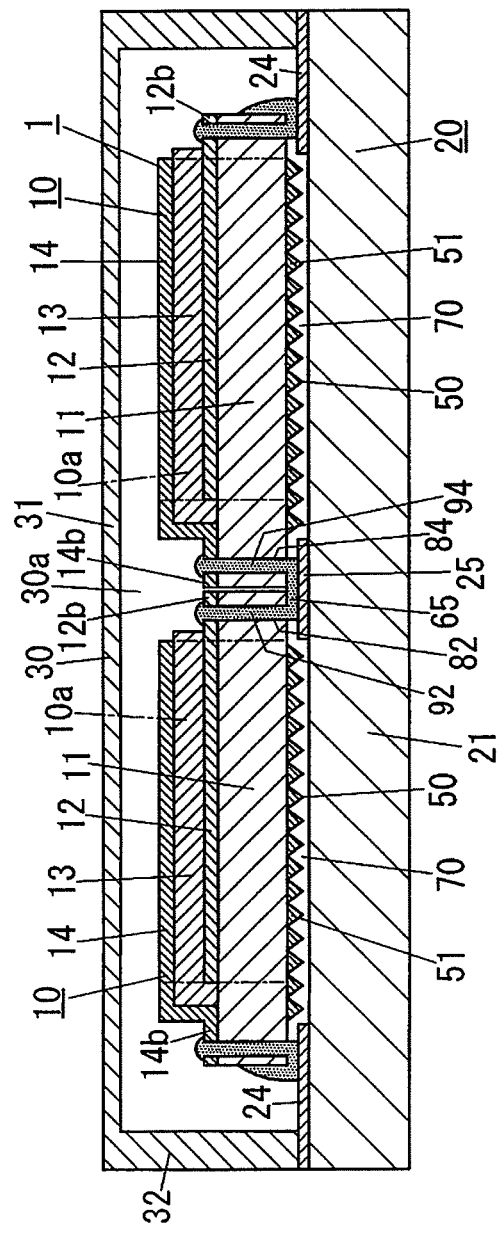
FIG. 18 is a schematic cross-sectional view of a planar light emitting device of Embodiment 5.

Hereinafter, a planar light emitting device of the present embodiment will now be described based on FIG. 18.

The basic configuration of the planar light emitting device of the present embodiment is approximately the same as that of Embodiment 1, and Embodiment 5 is different from Embodiment 1 in that plural organic EL elements 10 (two in the example shown) are connected in series. Note that the same reference numerals are given to constituent elements similar to Embodiment 1 and description thereof will be omitted.

Here, in adjacent organic EL elements 10, the first through hole wire 92 of one organic EL element 10 and the second through hole wire 94 of the other organic EL element 10 are electrically connected to each other by a connection portion 65 made of conductive paste (for example, silver paste or the like) on the first face side of each organic EL element 10. It is preferable that the connection portion 65 is formed by the same material as that of other connection portions 62 and 64.

Also, the connection portions 65 also are electrically connected to a conductive pattern 25 formed on the first surface of the second transparent substrate 21 in the base substrate 20. Accordingly, it is possible to reduce the resistance of a portion that electrically connects the organic EL elements 10.

The conductive pattern 25 is formed by the same material as that of external connection electrodes 22 and 24. Also, the thickness of the conductive pattern 25 is set to the same thickness as that of the external connection electrodes 22 and 24, and the conductive pattern is formed at the same time as the external connection electrodes 22 and 24.

Figure 20:
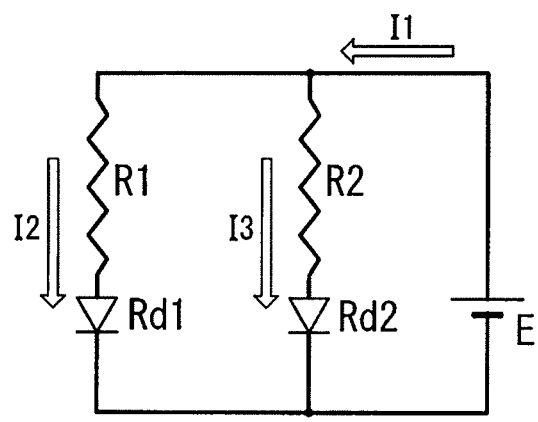
FIG. 20 is a diagram illustrating an operation in a comparative example of the planar light emitting device above.

Incidentally, assuming that the resistances of anodes 12 of organic EL elements 10 are respectively R1 and R2, and the resistances of organic EL layers 13 of organic EL elements 10 are respectively Rd1 and Rd2 in the case where two organic EL elements 10 are connected in parallel as in Embodiment 1, an equivalent circuit for a case where a direct-current power supply E is connected between the external connection electrodes 22 and 24 is a circuit shown in FIG. 20. Therefore, since current flows in each organic EL element 10 such that the voltages applied to the organic EL elements 10 are equal in the case where two organic EL elements 10 are connected in parallel, if the resistance R1 and the resistance R2 are different from each other, or the resistance Rd1 and the resistance Rd2 are different from each other, a difference arises between the current I2 that flows in one organic EL element 10 and the current I3 that flows in the other organic EL element 10, which leads to luminance unevenness. Note that the luminance of the organic EL element 10 is approximately proportional to a current value that flows therein.

Figure 19:
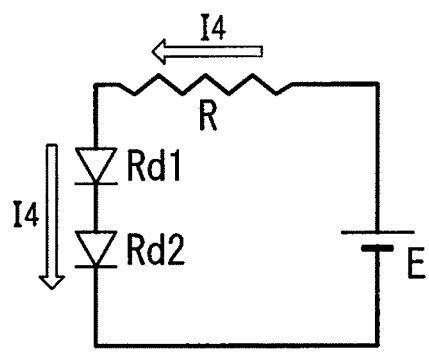
FIG. 19 is a diagram illustrating an operation of the planar light emitting device above.

In contrast, in the case where two organic EL elements 10 are connected in series as in the present embodiment, an equivalent circuit for a case where the direct-current power supply E is connected between the external connection electrodes 22 and 24 is a circuit shown in FIG. 19. Here, the resistance R is a combined resistance of anodes 12 of two organic EL elements 10 connected in series. Therefore, in the case where two organic EL elements 10 are connected in series, current values that flow in the organic EL elements 10 are equal, and therefore it is possible to reduce luminance unevenness.

Note that the auxiliary electrodes 23 described in Embodiment 1 may be provided as appropriate in the planar light emitting device of the present embodiment. Also, the number of organic EL elements 10 connected in series is not limited to two. Moreover, the present embodiment may be provided with the spacers 40 described in Embodiment 3 or Embodiment 4.

Embodiment 6

Hereinafter, a planar light emitting device of the present embodiment will now be described based on FIG. 21(a).

The basic configuration of the planar light emitting device of the present embodiment is approximately the same as that of Embodiment 5, and Embodiment 6 is different in that adjacent organic EL elements 10 are disposed so as to partially overlap. Note that the same reference numerals are given to constituent elements similar to Embodiment 5 and description thereof will be omitted.

In an organic EL element module unit 1 in the present embodiment, portions (end portions of the organic EL elements 10 in the lateral direction that are located outside the light emitting portions 10a) of adjacent organic EL elements 10 are overlapped such that the anode extension part 12b of one organic EL element 10 of adjacent organic EL elements 10 and the cathode extension part 14b of the other organic EL element 10 overlap in the thickness direction. Accordingly, in the planar light emitting device of the present embodiment, in the anode extension part 12b located away from the base substrate 20 in the overlapped portions of the adjacent organic EL elements 10, the first through hole wire 92 and the second through hole wire 94 that are continuous in the thickness direction are electrically connected to each other, and the second through hole wire 94 is electrically connected to the conductive pattern 25 via the connection portion 65.

Thus, in the planar light emitting device of the present embodiment, adjacent organic EL elements 10 are disposed so as to partially overlap, and therefore as compared with Embodiment 5, the area of a non-light emitting portion formed between adjacent organic EL elements 10 can be reduced.

Figure 21:
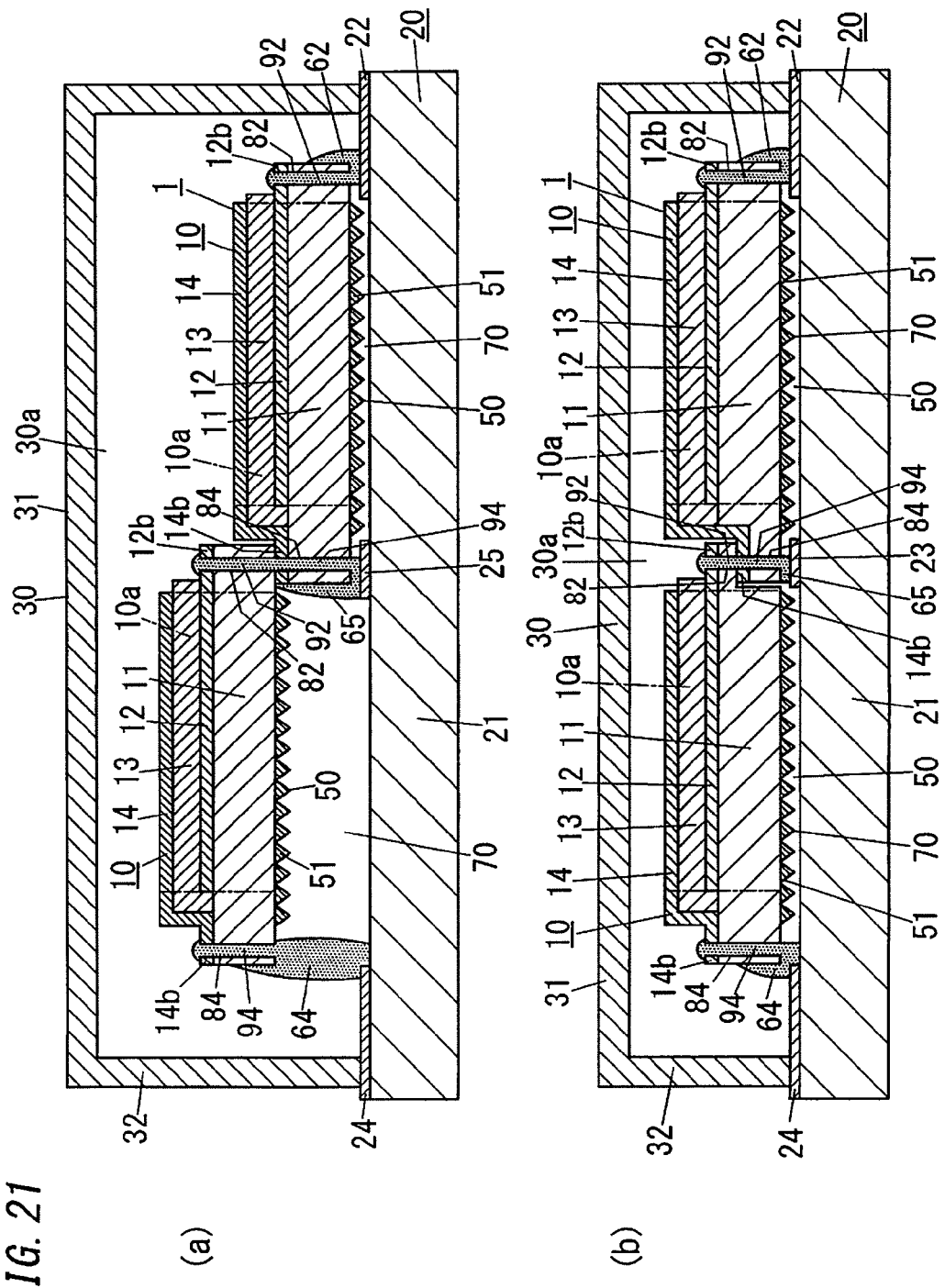
FIGS. 21(a) and 21(b) show (a) schematic cross-sectional view of a planar light emitting device of Embodiment 6 and (b) a schematic cross-sectional view of a variation of the planar light emitting device of Embodiment 6.

Also, the configuration shown in FIG. 21(b) may be adopted. In FIG. 21(b), plural organic EL elements 10 of the organic EL module are distinguished as a left side organic EL element 10 and a right side organic EL element 10. The left side organic EL element 10 is defined as a first organic EL element 10. The right side organic EL element 10 is defined as a second organic EL element 10.

In other words, the plural organic EL elements 10 of the organic EL module include the first organic EL element and the second organic EL element. The first organic EL element and the second organic EL element are arranged adjacent to each other. The first organic EL element partially overlaps the second organic EL element in the thickness direction of the first transparent substrate 11.

Also, the first organic EL element is arranged so as to be displaced from the second organic EL element in the thickness direction of the first transparent substrate 11, and accordingly the first organic EL element partially overlaps the second organic EL element in the thickness direction of the first transparent substrate 11.

Also, the first transparent substrate 11 of the first organic EL element includes a second face side, and the second face side is positioned opposite from the first face side. A first cut-out portion is provided at one end of the second face side of the first organic EL element. A second cut-out portion is provided at one end on the first face side of the second organic EL element. The first organic EL element and the second organic EL element are arranged such that the first cut-out portion overlies the second cut-out portion.

The first through hole 82 of the first organic EL element and the second through hole 84 of the second organic EL element are aligned in the thickness direction of the first transparent substrate 11.

With such a configuration, it is possible to reduce the area of the non-light emitting portion.

Note that the auxiliary electrode 23 described in Embodiment 1 may be provided as appropriate in the planar light emitting device of the present embodiment. Also, the number of organic EL elements 10 connected in series is not limited to two. Moreover, the present embodiment may be provided with the spacers 40 described in Embodiment 3 or Embodiment 4.

Embodiment 7

Hereinafter, a planar light emitting device of the present embodiment will now be described based on FIG. 22(a).

The basic configuration of the planar light emitting device of the present embodiment is approximately the same as that of Embodiment 1, and Embodiment 7 is different from Embodiment 1 in that each of the first through hole wires 92 and the second through hole wires 94 is a metal portion formed by electroplating. Note that the same reference numerals are given to constituent elements similar to Embodiment 1 and description thereof will be omitted.

Figure 22:
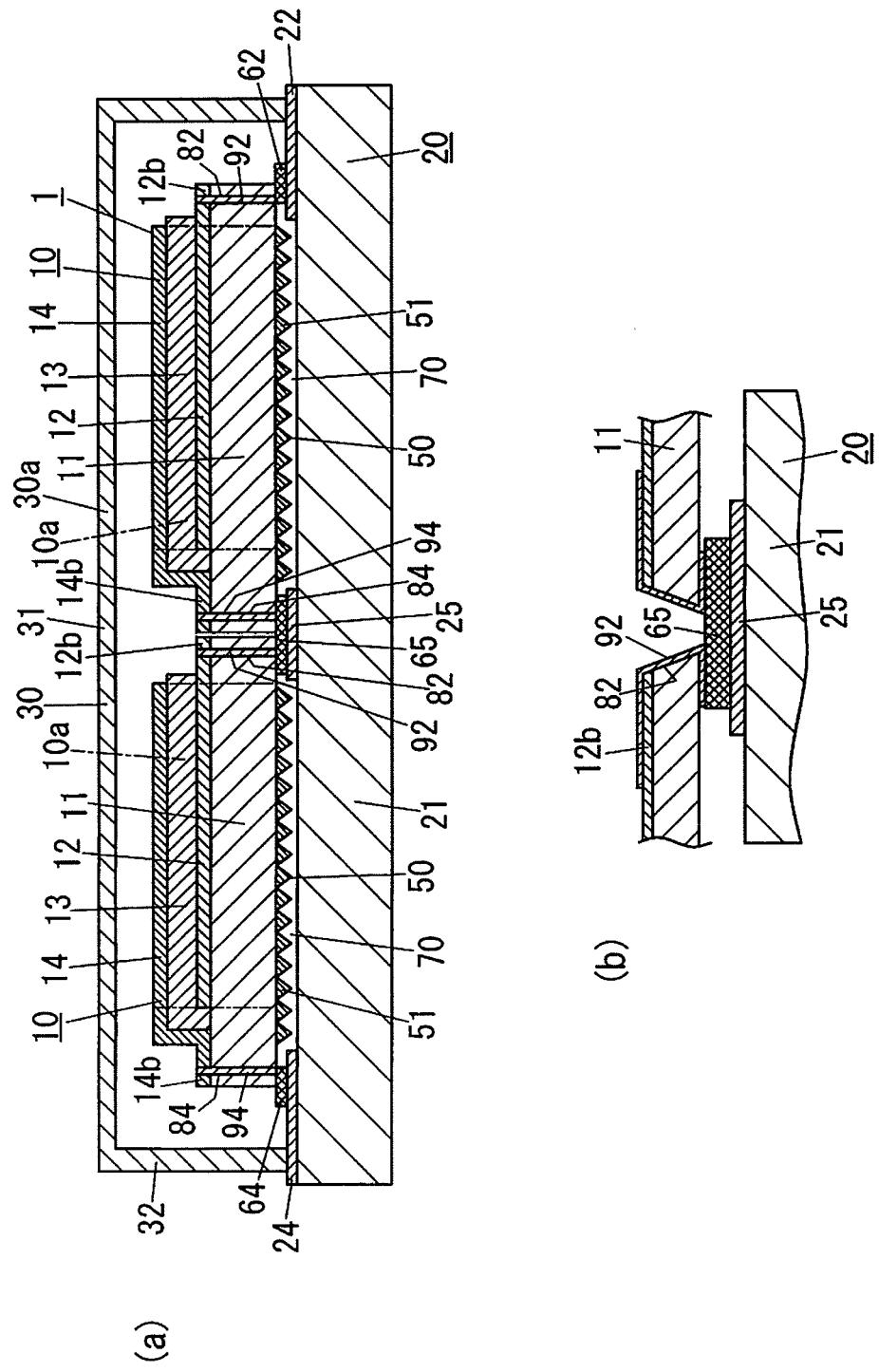
FIGS. 22(a) and 22(b) relate to a planar light emitting device of Embodiment 7, and shows (a) a schematic cross-sectional view and (b) a schematic cross-sectional view of a primary part thereof.

In the case where the first through hole wires 92 are the above-described metal portions, it is preferable that the first through hole 82 of the first transparent substrate 11 is formed into a tapered shape in which an opening area gradually changes as shown in FIG. 22(b).

With the planar light emitting device of the present embodiment, it is possible to reduce the amount of a protrusion from the surface of the anode extension part 12b in the first through hole wire 92 and the amount of a protrusion from the surface of the cathode extension part 14b in the second through hole wire 94, and thus it is possible to reliably suppress an unnecessary short circuit. Also, with the planar light emitting device of the present embodiment, it is thereby possible to further shorten the distance between light emitting portions 10a of adjacent organic EL elements 10.

Moreover, although each of the connection portions 62, 64 and 65 is an anisotropic conductive film (ACF) instead of conductive paste in the planar light emitting device of the present embodiment, the present embodiment is not limited to this and they may be anisotropic conductive paste (ACP). An anisotropic conductive film or anisotropic conductive paste is adhesive material capable of establishing conduction in a direction in which pressure is applied. Therefore, the organic EL elements 10 are mounted on and pressed against the base substrate 20 so that conduction can be established in the thickness direction of the base substrate 20. Hence, there is no conduction in the lateral direction, and thus it is possible to suppress the occurrence of a short circuit.

Embodiment 8

Figure 23:
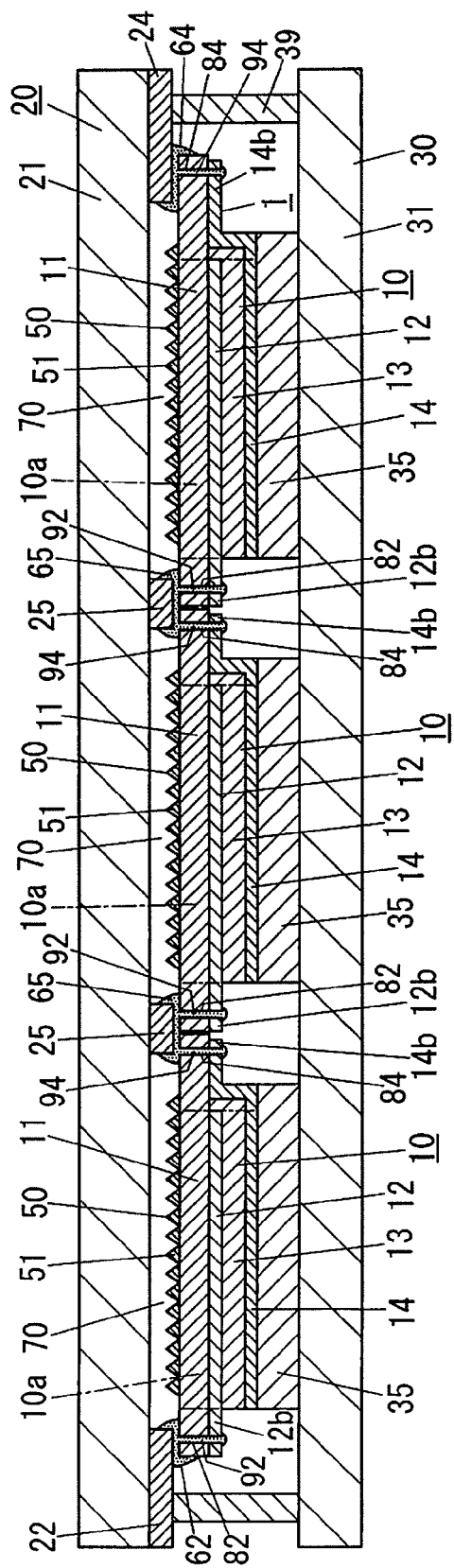
FIG. 23 is a schematic cross-sectional view of a planar light emitting device of Embodiment 8.
Figure 24:
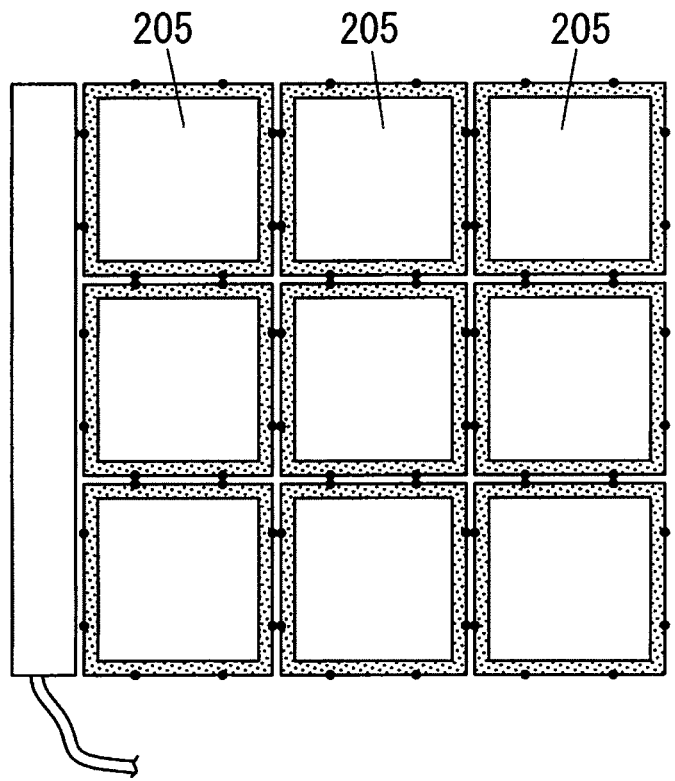
FIG. 24 is a schematic plan view of a planar light emitting device of a conventional example.
Figure 25:
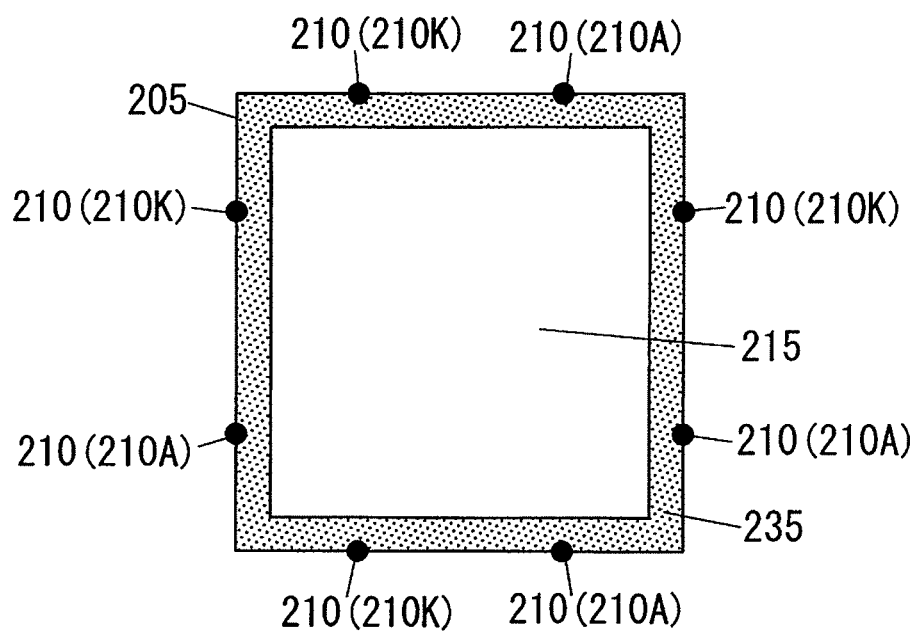
FIG. 25 is a schematic plan view of a tile in the planar light emitting device above.
Figure 26:
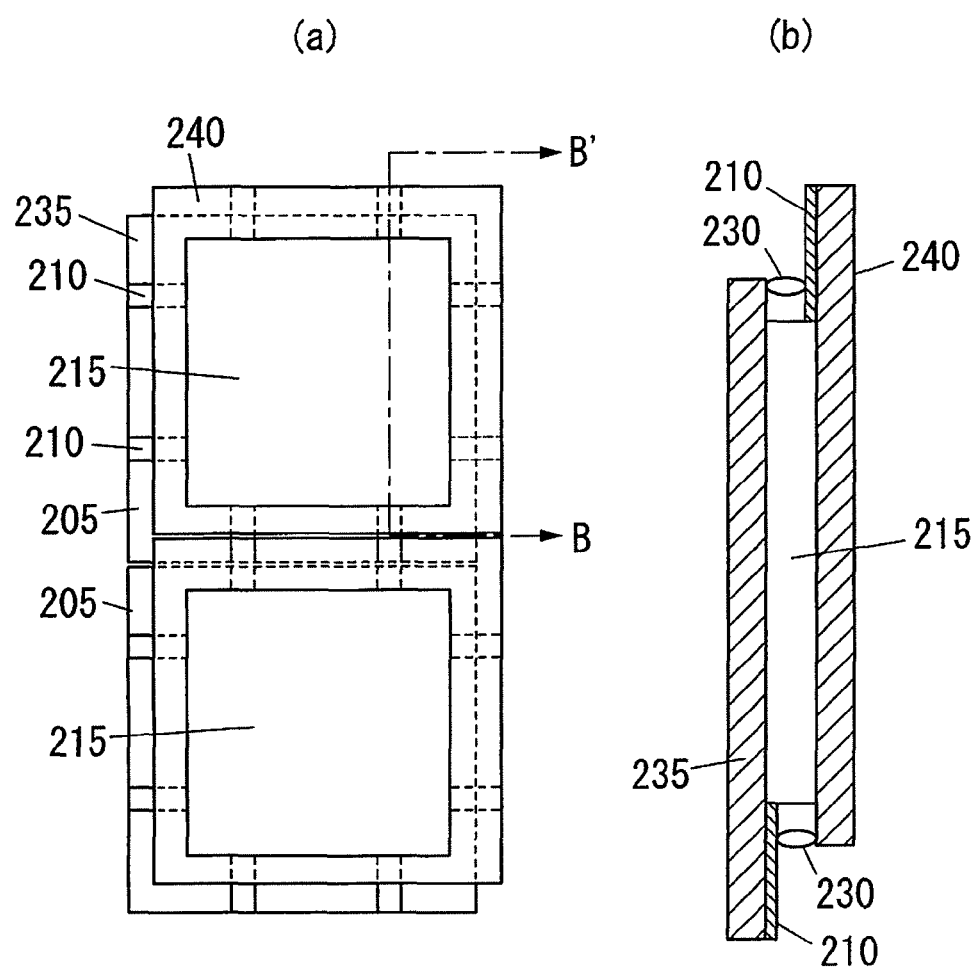
FIG. 26 relates FIGS. 26(a) and 26(b) relate to the tile in the planar light emitting device above, and shows (a) a schematic plan view in the case where two tiles are arranged side by side and (b) a schematic cross-sectional view taken along B-B' in FIG. 26(a).
Figure 27:
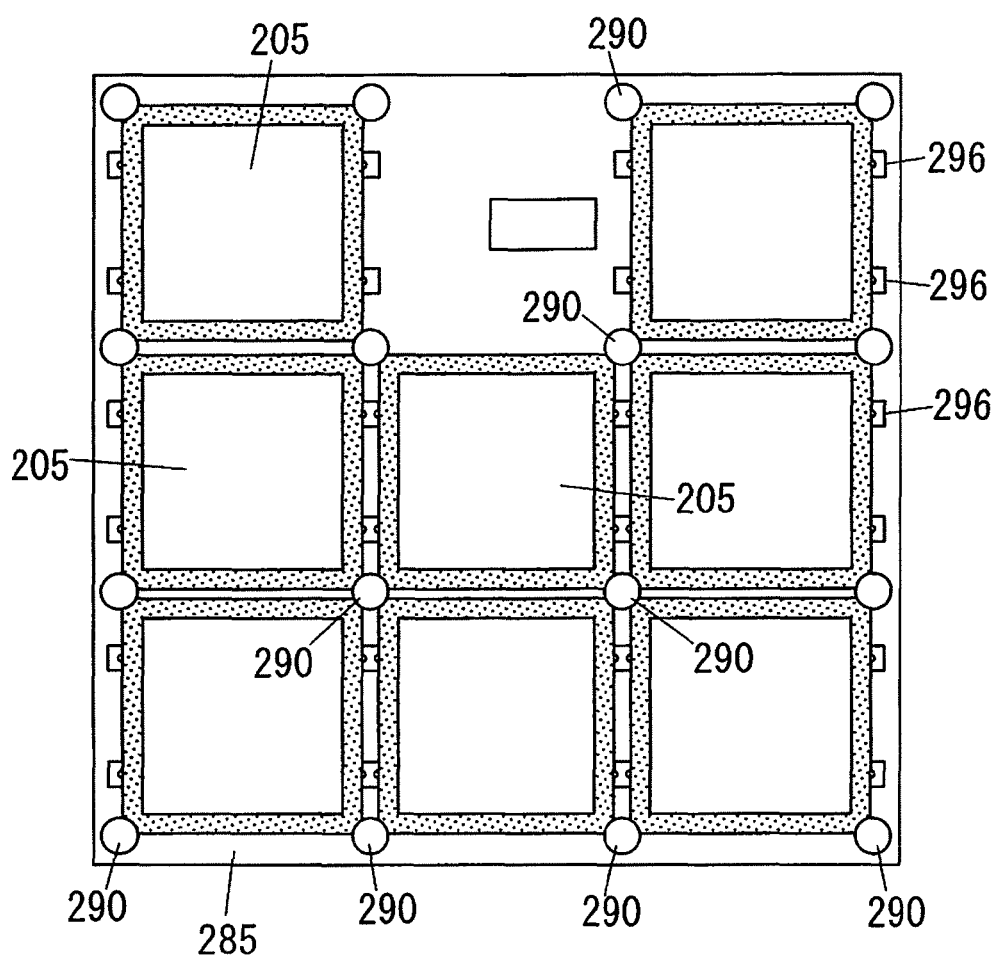
FIG. 27 is a schematic plan view of a planar light emitting device of another conventional example.

Hereinafter, a planar light emitting device of the present embodiment will now be described based on FIG. 23.

The basic configuration of the planar light emitting device of the present embodiment is approximately the same as that of Embodiment 5, and Embodiment 8 is different from Embodiment 5 in that the protector 30 is a flat plate-shaped glass substrate, and a joint portion 39 that joins the protector 30 to the base substrate 20 is formed by flitted glass. Note that the same reference numerals are given to constituent elements similar to Embodiment 5 and description thereof will be omitted.

Also, in the planar light emitting device of the present embodiment, an affix layer 35 that affixes the organic EL element 10 and the protector 30 is interposed between the second face side of the organic EL element 10 and the protector 30. Thus, it is possible to stably fix the organic EL elements 10. Here, the affix layer 35 has a function as a heat transfer portion that transfers heat generated in the organic EL elements 10 onto the side of the protector 30. Note that for example, a silicone resin, a fluorine-based resin, thermally conductive grease or the like can be adopted as material for the affix layer 35.

The affix layer 35 is provided between the organic EL element 10 and the protector 30 in the planar light emitting device of the present embodiment, and therefore it is possible to allow heat generated in the organic EL elements 10 to be efficiently dissipated toward the side of the protector 30 and to increase the service life and luminance of the organic EL element 10.

Also, the joint portion 39 that joins the protector 30 and the base substrate 20 is formed by flitted glass in the planar light emitting device of the present embodiment, and therefore it is possible to prevent outgassing via the joint portion 39 and to increase moisture proofness and to increase the reliability for a long period. Moreover, although in the case where the joint portion 39 is formed by resin material such as a thermosetting resin or the like, it is preferable that a sealing portion of 3 mm or more is provided so as to secure air tightness, in the present embodiment, the joint portion 39 is formed by fitted glass, and therefore it is possible to secure air tightness even though a sealing portion is of about 1 mm. Therefore, it is possible to reduce the area of a non-light emitting portion in a front view of the planar light emitting device of the present embodiment.

Note that although three organic EL elements 10 are connected in series in the planar light emitting device of the present embodiment, the number of organic EL elements 10 connected in series is not particularly limited.

Incidentally, in the process of preparing the planar light emitting devices of the respective embodiments described above, when the organic EL elements 10 are mounted on the base substrate 20, the organic EL elements 10 may be joined to the base substrate 20 with an adhesive or a double sided tape, which has a reduced effect of outgas on the organic EL elements 10 due to reduced outgas, before joining, which also serves as an electrical connection with conductive paste or the like. In this case, it is preferable to use a transparent adhesive or a transparent double sided tape in order not to depreciate the design of the planar light emitting device. Also, it is preferable to join the organic EL elements 10 and the base substrate 20 at positions where they do not overlap the light emitting portions 10*a* of the organic EL elements 10, and for example, the four corners of the organic EL element 10 may be joined to the base substrate 20, or the periphery of the organic EL element 10 may be joined to the base substrate 20.

The above-described joint portion 39 functions as a spacer between the second transparent substrate 21 and the protector 30, and the present invention is not limited to a case where the joint portion 39 is formed using only fitted glass, and the joint portion 39 may be formed using, for example, a frame member made of alloy and fritted glass formed on faces of the frame member respectively facing the second transparent substrate 21 and the protector 30. Here, although it is preferable to use Kovar having a thermal expansion coefficient close to those of the second transparent substrate 21 and the protector 30 as alloy that serves as material for the frame member, the alloy is not limited to Kovar, and for example, 42 Alloy may be used. Kovar is an alloy in which nickel and cobalt are mixed with iron, and is one type of alloys having a low thermal expansion coefficient around a room temperature among metals, and has a thermal expansion coefficient value close to those of alkali-free glass, blue soda glass, borosilicate glass and the like. An example of a component percentage of Kovar is, in % by weight, nickel: 29 wt %, cobalt: 17 wt %, silicon: 0.2 wt %, manganese: 0.3 wt %, and iron: 53.5 wt %. There is no particular limitation on the component percentage of Kovar, and any Kovar having an appropriate component percentage may be adopted such that the thermal expansion coefficient thereof is equal to the thermal expansion coefficients of the second transparent substrate 21 and the protector 30. Also, it is preferable that material whose thermal expansion coefficient can match the thermal expansion coefficient of alloy is adopted as fitted glass for this case. Here, in the case where alloy is Kovar, it is preferable to use Kovar glass as material for fritted glass. Also, For forming such a joint portion 39, for example, fitted glass is applied to both faces of a plate member in the thickness direction that is made of alloy such as Kovar so as to have a predetermined pattern (in the present embodiment, a rectangular frame-shaped pattern), and after drying and firing, press punching is performed, as a result of which the joint portion 39 can be formed.

Note that instead of conductive paste described in Embodiments 1 to 6 and 8, if material in which conductive beads having a particle size of several μm to several tens of μm are dispersed in a binder such a thermosetting resin or the like is used, as compared with Embodiments 1 to 6 and 8, it is possible to lower the resistances of the first through hole wires 92 and the second through hole wires 94, and to reduce cost due to improvement in the utilization efficiency of material. Also, in the case where material in which conductive beads having a particle size of several μm to several tens of μm are dispersed in a binder such as a thermosetting resin or the like is used, as compared with a case where the first through hole wires 92 and the second through hole wires 94 are metal portions formed by electroplating as in Embodiment 7, it is possible to reduce cost due to improvement in the utilization efficiency of material.

Note that in the above-described embodiments, the first transparent substrate 11 may be a film. Also, the first transparent substrate 11 may be a resin applied onto the second transparent substrate 21.

Also, in the above-described embodiments, the organic EL element 10 includes an organic EL layer 13. Moreover, the organic EL layer 13 includes the anode 12, the hole transport layer 133, the light emitting layer 134, the electron transport layer 135, the electron injection layer 136 and the cathode 14.

In addition, the anode 12, the hole transport layer 133, the light emitting layer 134, the electron transport layer 135, the electron injection layer 136, and the cathode 14 are arranged in order. However, the structure of the organic EL element 10 is not limited to the structure of the above-described embodiments.

REFERENCE SIGNS LIST

1 Organic EL element module unit
10 Organic EL element
10a Light emitting portion
11 First transparent substrate
12 Anode
12b First part
13 Organic EL layer
14 Cathode
14b Second part
21 Second transparent substrate
22 External connection electrode
23 Auxiliary electrode
24 External connection electrode
30 Protector
31 Rear plate portion
32 Frame portion
40 Spacer
82 First through hole
84 Second through hole
92 First through hole wire
94 Second through hole wire

The invention claimed is:

1. A planar light emitting device comprising:
an organic electroluminescent element module unit in which plural organic electroluminescent elements are arranged side by side, each of the organic electroluminescent elements including an anode, a light emitting layer and a cathode that are formed on a first surface side of a first transparent substrate;
a second transparent substrate disposed on a light extraction side of the organic electroluminescent element module unit; and
a protector designed to, together with the second transparent substrate, enclose the organic electroluminescent element module unit;
wherein
the organic electroluminescent element includes:
a light emitting portion defined as an overlap of the first transparent substrate, the anode, the light emitting layer and the cathode in a thickness direction of the first transparent substrate;
a first through hole wire that is formed inside a first through hole and is electrically connected to the anode, the first through hole penetrating a first part of the anode that is formed outside the light emitting portion and the first transparent substrate; and
a second through hole wire that is formed inside a second through hole and is electrically connected to the cathode, the second through hole penetrating a second part of the cathode that extends on the first surface of the first transparent substrate and the first transparent substrate, and
an external connection electrode for receiving high potential and an external connection electrode for receiving low potential which serve to supply power to the organic electroluminescent element module are disposed on a first surface side of the second transparent substrate so as to avoid a projection region of the light emitting portion.

2. The planar light emitting device according to claim 1, comprising an auxiliary electrode disposed on the first surface side of the second transparent substrate so as to be overlapped with the first part, the auxiliary electrode being electrically connected to the first part, and the auxiliary electrode being made of material having a smaller specific electrical resistance than that of the anode.

3. The planar light emitting device according to claim 1, wherein, in the organic electroluminescent element module unit, the adjacent organic electroluminescent elements are disposed so as to partially overlap.

4. The planar light emitting device according to claim 1, wherein the protector includes:
a rear plate portion facing the second transparent substrate; and
a frame portion interposed between the rear plate portion and the second transparent substrate,
plural spacers each formed into a cylindrical shape are interposed between a base substrate and the rear plate portion, the base substrate including the second transparent substrate and the respective external connection electrodes formed thereon, and
the spacers are inserted into the first through holes.

5. The planar light emitting device according to claim 4, wherein the spacers are made of electrically conductive material.

6. The planar light emitting device according to claim 1, wherein the protector includes:
a rear plate portion that opposes the second transparent substrate; and
a frame portion that is interposed between the rear plate portion and the second transparent substrate,
plural spacers each formed into a cylindrical shape are interposed between a base substrate and the rear plate portion, the base substrate including the second transparent substrate and the respective external connection electrodes formed thereon, and
the spacers penetrate the first transparent substrate at positions that avoid the first through hole, the second through hole and the light emitting portion.

7. The planar light emitting device according claim 1, wherein the plural organic electroluminescent elements are connected in series with each other.

* * * * *